(12) United States Patent  
Yahashi

(10) Patent No.: US 8,492,824 B2
(45) Date of Patent: Jul. 23, 2013

(54) SEMICONDUCTOR MEMORY DEVICE AND METHOD FOR MANUFACTURING SAME

(75) Inventor: Katsunori Yahashi, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/224,484

(22) Filed: Sep. 2, 2011

(65) Prior Publication Data

US 2012/0211816 A1    Aug. 23, 2012

(30) Foreign Application Priority Data

Feb. 22, 2011    (JP) .................................. 2011-035628

(51) Int. Cl.
*H01L 29/76*    (2006.01)

(52) U.S. Cl.
USPC ......................................................... 257/314

(58) Field of Classification Search
USPC ........................... 257/314, E21.158, E29.226
See application file for complete search history.

(56) References Cited

U.S. PATENT DOCUMENTS

| 7,989,880 | B2 * | 8/2011 | Wada et al. .................... 257/329 |
| 2009/0283819 | A1 | 11/2009 | Ishikawa et al. | |
| 2010/0207195 | A1 * | 8/2010 | Fukuzumi et al. ............ 257/326 |
| 2010/0323505 | A1 | 12/2010 | Ishikawa et al. | |
| 2011/0049607 | A1 | 3/2011 | Yahashi | |
| 2011/0201167 | A1 * | 8/2011 | Satonaka et al. .............. 438/268 |

FOREIGN PATENT DOCUMENTS

JP    2011-60958    3/2011

OTHER PUBLICATIONS

H. Tanaka, et al., "Bit Cost Scalable Technology with Punch and Plug Process for Ultra High Density Flash Memory," Symposium on VLSI Technology, 2007, 2 Pages.

* cited by examiner

*Primary Examiner* — Thao P. Le
(74) *Attorney, Agent, or Firm* — Oblon, Spivak, McClelland, Maier & Neustadt, L.L.P.

(57) ABSTRACT

According to one embodiment, a method for manufacturing a semiconductor memory device includes: forming a stacked body including insulating films stacked alternately with electrode films, a memory hole is made in one portion of the stacked body to extend in a stacking direction, a charge storage layer is provided on an inner surface of the memory hole, a semiconductor member is provided in the memory hole; forming a hard mask on the stacked body, the hard mask has a plurality of holes of mutually different sizes; plugging the smallest of the holes while shrinking the other holes by depositing a mask material; making contact holes by removing a prescribed number of the insulating films and a prescribed number of the electrode films in regions directly under the other holes by performing etching using the mask material and the hard mask as a mask; and filling conductive material into the contact holes.

8 Claims, 14 Drawing Sheets

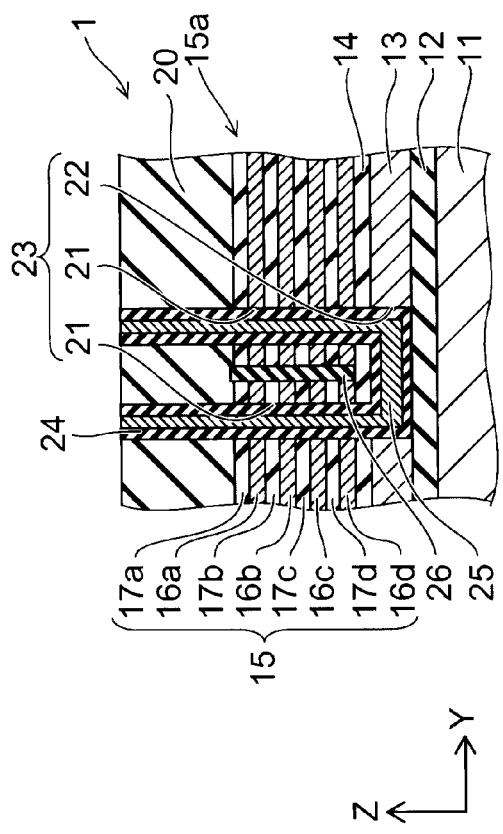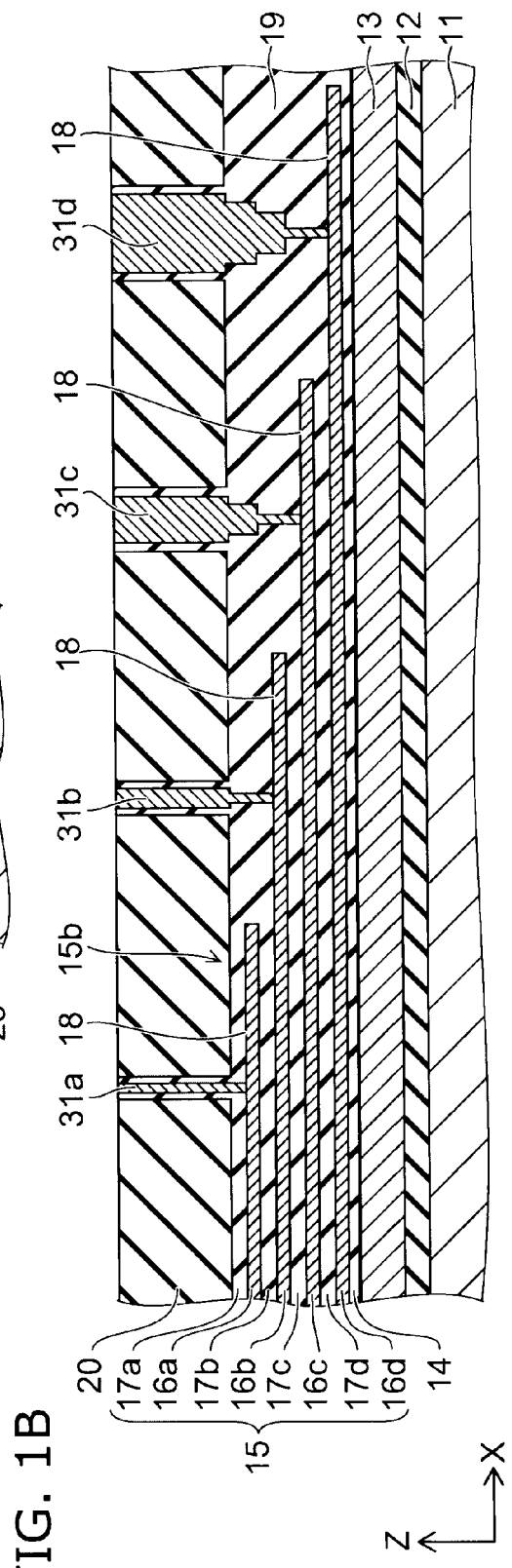
FIG. 1A
FIG. 1B

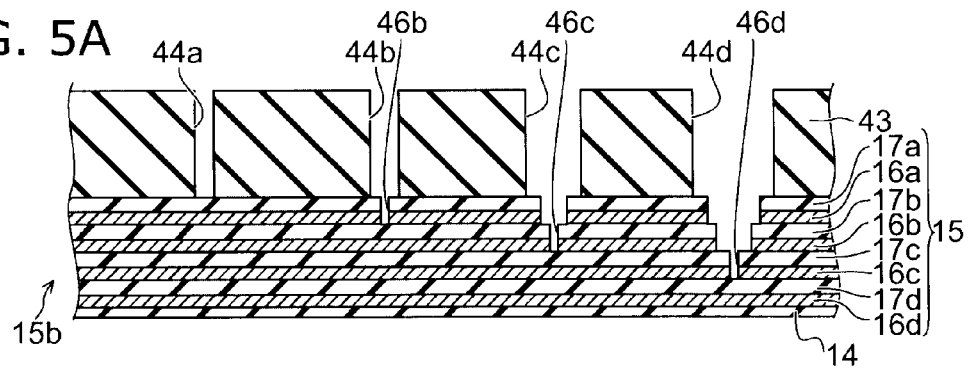
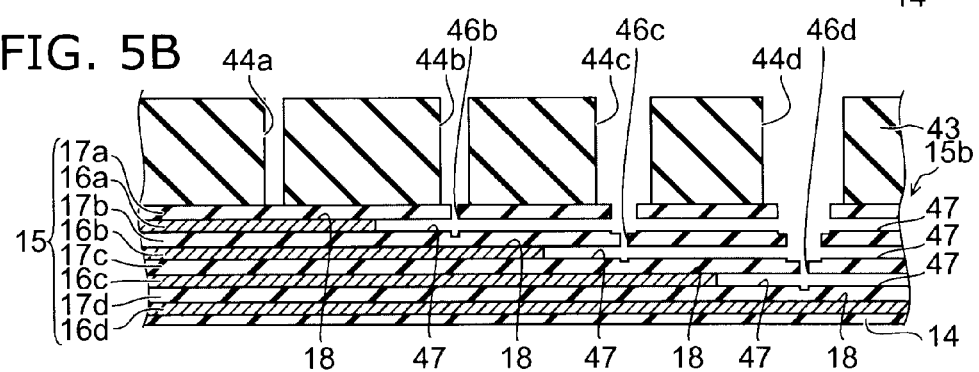
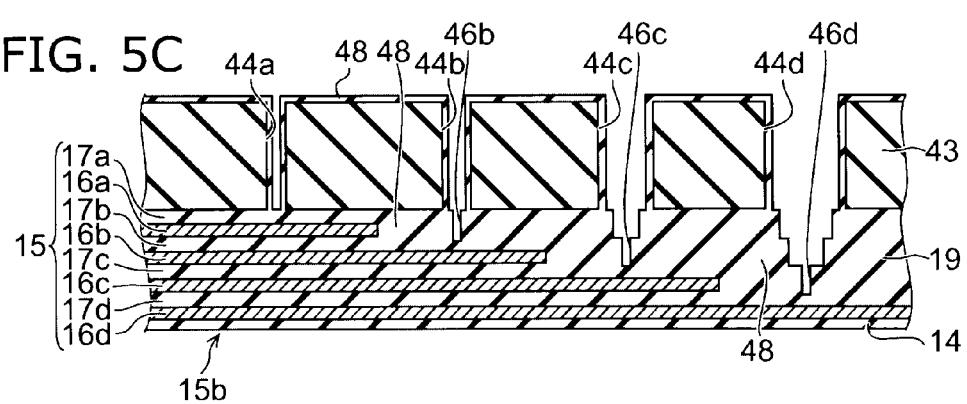
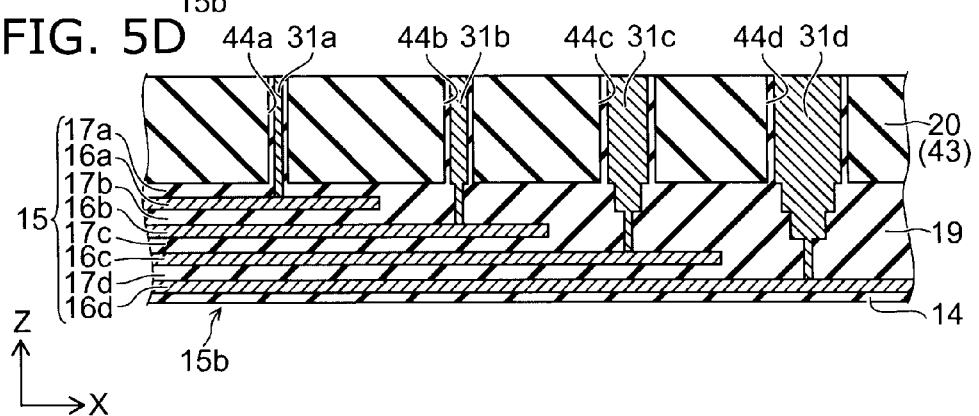

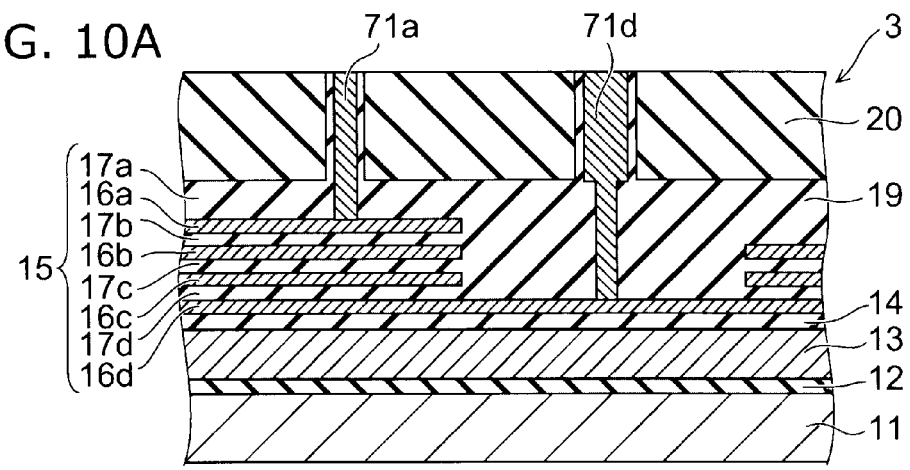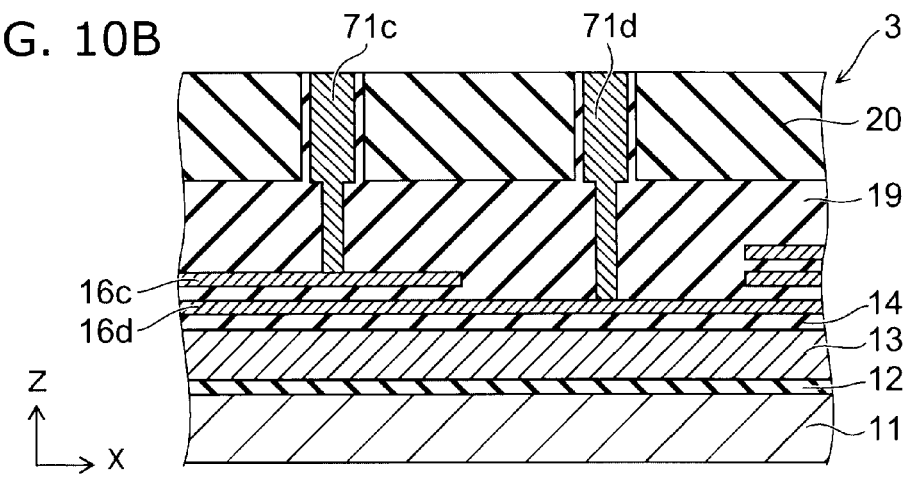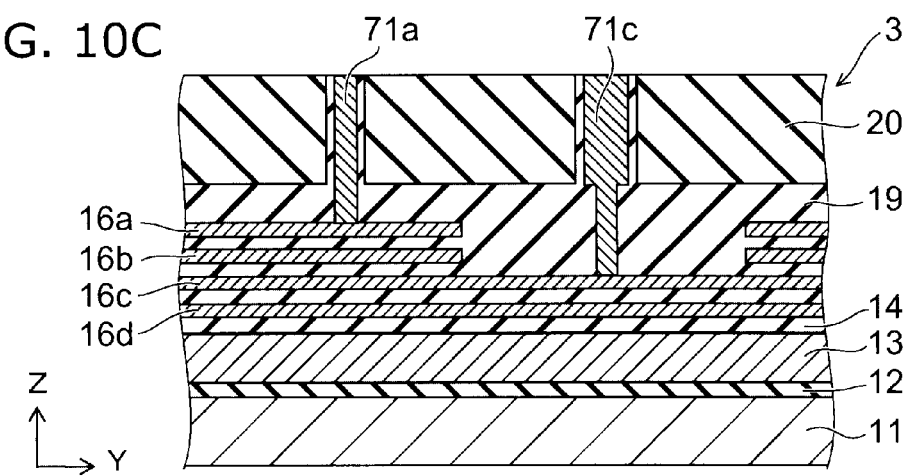

SEMICONDUCTOR MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2011-035628, filed on Feb. 22, 2011; the entire contents of which are incorporated herein by reference.

FIELD

Embodiments described herein relate generally to a semiconductor memory device and a method for manufacturing the same.

BACKGROUND

Collectively patterned stacked memory has been proposed as a method to increase the capacity and reduce the cost of semiconductor memory devices. Collectively patterned stacked memory is manufactured by forming a stacked body on a semiconductor substrate by alternately stacking insulating films and electrode films, subsequently making a memory hole in the stacked body using lithography, depositing a blocking layer, a charge storage layer, and a tunneling layer in this order inside the memory hole, and filling a silicon pillar into the memory hole. In such a stacked memory, memory transistors are formed at the intersections between the electrode films and the silicon pillar; and these are used as memory cells. The end portion of the stacked body has a stairstep configuration in which a terrace is formed for each of the electrode films; and a contact is connected to each of the electrode films from above.

BRIEF DESCRIPTION OF THE DRAWINGS

FIGS. 1A and 1B are cross-sectional views illustrating a semiconductor memory device according to a first embodiment;

FIGS. 2A to 5D are cross-sectional views of processes, illustrating a method for manufacturing the semiconductor memory device according to the first embodiment;

FIGS. 10A to 10C are cross-sectional views illustrating the semiconductor memory device according to the third embodiment.

DETAILED DESCRIPTION

Figure 2A:
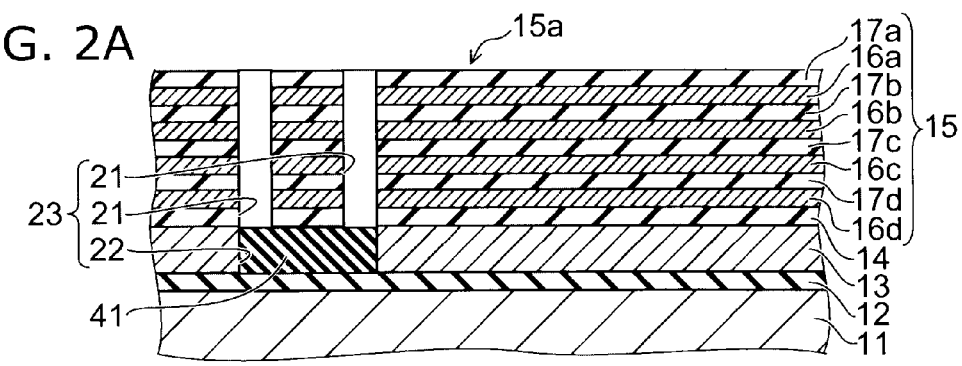

In general, according to one embodiment, a semiconductor memory device includes a stacked body, contacts, a semiconductor member and a charge storage layer. The stacked body includes a plurality of electrode films stacked alternately with a plurality of insulating films. A configuration of an end portion of the stacked body is a stairstep configuration including a terrace formed for each of the electrode films. Each of the contacts has a lower end connected to a portion of the electrode film forming the terrace. The semiconductor member is provided inside a portion of the stacked body other than the end portion to extend in a stacking direction of the insulating films and the electrode films. The charge storage layer is provided between the electrode film and the semiconductor member. And a diameter of an upper end portion of one of the contacts connected to one of the electrode films is larger than a diameter of an upper end portion of one other of the contacts connected to one other of the electrode films positioned higher than the one of the electrode films. The one of the contacts is finer downward in stages.

In general, according to other embodiment, a method for manufacturing a semiconductor memory device includes: forming a stacked body which includes a plurality of insulating films stacked alternately with a plurality of electrode films, a memory hole is made in one portion of the stacked body to extend in a stacking direction of the insulating films and the electrode films, a charge storage layer is provided on an inner surface of the memory hole, a semiconductor member is provided in the memory hole; forming a hard mask on the stacked body, the hard mask has a plurality of holes of mutually different sizes made in a region directly above a portion of the stacked body other than the one portion; plugging the smallest of the holes while shrinking the other holes by depositing a mask material; making contact holes by removing a prescribed number of the insulating films and a prescribed number of the electrode films in regions directly under the other holes by performing etching using the mask material and the hard mask as a mask; making a gap by removing one portion of the electrode films by performing etching via the contact holes; filling insulating material into the gap; and filling conductive material into the contact holes.

Embodiments of the invention will now be described with reference to the drawings.

First, a first embodiment will be described.

FIGS. 1A and 1B are cross-sectional views illustrating a semiconductor memory device according to the first embodiment. FIG. 1A illustrates a central portion of the stacked body; and FIG. 1B illustrates an end portion of the stacked body.

FIGS. 1A and 1B schematically illustrate the semiconductor memory device; and the sizes of the portions are not always proportional to the sizes of the actual device. This is similar for other drawings described below.

As illustrated in FIGS. 1A and 1B, a silicon substrate 11 is provided in the semiconductor memory device 1 according to the embodiment. An insulating film 12 is provided on the silicon substrate 11; and a back gate electrode film 13 made of, for example, polysilicon is provided thereon. An insulating film 14 is provided on the back gate electrode film 13.

A stacked body 15 is provided on the insulating film 14. In the stacked body 15, multiple electrode films 16 and multiple insulating films 17, e.g., four of each, are stacked alternately. The electrode film 16 is formed of, for example, polysilicon; and the insulating film 17 is formed of, for example, silicon oxide. A central portion 15a and an end portion 15b are provided in the stacked body 15. An inter-layer insulating film 19 made of an insulating material such as, for example, silicon oxide, etc., is provided around the stacked body 15. An upper layer insulating film 20 made of, for example, silicon oxide is provided above the stacked body 15 and the inter-layer insulating film 19.

Hereinbelow, for convenience of description in the specification, an XYZ orthogonal coordinate system is introduced. In this coordinate system, of two mutually orthogonal directions parallel to the upper surface of the silicon substrate 11, a direction from the central portion 15a toward the end portion 15b is taken as an X direction; and the other is taken as a Y direction. A direction orthogonal to both the X direction and the Y direction, i.e., the vertical direction, is taken as a Z direction. The stacking direction of the electrode films 16 and the insulating films 17 is the Z direction.

First, the central portion 15a of the stacked body 15 will be described.

In the central portion 15a of the stacked body 15, a memory hole 21 extending in the Z direction is made to pierce the stacked body 15. The memory hole 21 is arranged in a matrix configuration along the X direction and the Y direction. A recess 22 having a rectangular parallelepiped configuration with the Y direction as the longitudinal direction is made in the upper surface of the back gate electrode film 13 in the region directly under the central portion 15a of the stacked body 15. A pair of the memory holes 21 adjacent to each other in the Y direction reach two end portions of the recess 22. Thereby, a U-shaped hole 23 having a U-shaped configuration is made of one of the recesses 22 and two of the memory holes 21 linked to the two end portions of the recess 22.

A memory film 24 is formed on the inner surface of the U-shaped hole 23. The memory film 24 includes a blocking layer, a charge storage layer, and a tunneling layer (these are not illustrated) stacked in order from the side contacting the inner surface of the U-shaped hole 23. The blocking layer is a layer in which current substantially does not flow even in the case where a voltage within the range of the drive voltage of the semiconductor memory device 1 is applied and is formed of, for example, silicon oxide. The charge storage layer is a layer capable of storing charge, is a layer including, for example, trap sites of electrons, and is formed of, for example, silicon nitride. Although the tunneling layer normally is insulative, the tunneling layer is a layer that allows a tunneling current when a prescribed voltage within the range of the drive voltage of the semiconductor memory device 1 is applied and is formed of, for example, silicon oxide.

A semiconductor member 25 made of, for example, polysilicon is filled into the U-shaped hole 23. Therefore, the charge storage layer of the memory film 24 is disposed between the electrode films 16 and the semiconductor member 25. The portions of the semiconductor member 25 positioned inside the memory holes 21 are silicon pillars extending in the Z direction; and the portion positioned inside the recess 22 is a connection member extending in the Y direction. An insulating plate 26 spreading in the XZ plane is provided in the region directly above the recess 22 of the stacked body 15; and the electrode films 16 are divided along the Y direction by the insulating plate 26. In other words, each of the divided portions of the electrode film 16 extends along the X direction to reach the end portion 15b.

A selection gate electrode (not illustrated) extending in the X direction is provided on the upper layer insulating film 20 in the region directly above the central portion 15a. The silicon pillar pierces the selection gate electrode; and a gate insulating film (not illustrated) is provided between the selection gate electrode and the silicon pillar. A source line (not illustrated) extending in the X direction and a bit line (not illustrated) extending in the Y direction are provided above the selection gate electrodes. One silicon pillar of the pair of silicon pillars of the semiconductor member 25 is connected to the source line; and the other is connected to the bit line. Thereby, a memory cell transistor is formed at each intersection between the electrode films 16 and the silicon pillars in the central portion 15a. A memory string in which multiple memory cell transistors are connected in series is formed between the source line and the bit line.

The end portion 15b of the stacked body 15 will now be described.

The end portion 15b of the stacked body 15 is patterned into a stairstep configuration; and a terrace 18 is formed for each of the electrode films 16. In other words, the terraces 18 are formed of the upper surfaces of the electrode films 16 respectively. The electrode films 16 and the terraces 18 have a one-to-one correspondence; and the number of the terraces 18 formed is the number of the electrode films 16. In the embodiment, the terraces 18 are arranged in one column along the X direction.

Contacts 31 extending in the Z direction are provided in the inter-layer insulating film 19 in regions directly above the terraces 18. The lower ends of the contacts 31 are connected to the portions of the electrode films 16 that form the terraces 18 respectively. The number of the contacts 31 provided is the same as the number of the terraces 18; and the contacts 31 are arranged along the X direction. The configuration of the contact 31 as viewed from the Z direction is, for example, circular. The upper end of each of the contacts 31 is connected to one end of the word interconnect (not illustrated) provided on the upper layer insulating film 20; and the other end of the word interconnect is connected to a peripheral circuit (not illustrated) formed in the X direction as viewed from the stacked body 15.

Hereinbelow, the four electrode films 16 included in the stacked body 15 also are called the electrode films 16a, 16b, 16c, and 16d in order from the upper layer side. Similarly, the four insulating films 17 included in the stacked body 15 also are called the insulating films 17a, 17b, 17c, and 17d in order from the upper layer side. The contacts 31 connected to the electrode films 16a, 16b, 16c, and 16d also are called the contacts 31a, 31b, 31c, and 31d respectively.

The diameter of the contact 31a is substantially constant in the Z direction. The diameter of the contact 31b changes to have two stages along the Z direction; and the lower portion is finer than the upper portion. The diameter of the lower portion of the contact 31b is substantially equal to the diameter of the contact 31a. The diameter of the contact 31c changes to have three stages along the Z direction and is finer downward in stages. The diameter of the intermediate portion of the contact 31c is substantially equal to the diameter of the upper portion of the contact 31b; and the diameter of the lower portion of the contact 31c is substantially equal to the diameters of the lower portion of the contact 31b and the contact 31a. The diameter of the contact 31d changes to have four stages along the Z direction and is finer downward in stages. The diameter of the portion of the second level from the top of the contact 31d is substantially equal to the diameter of the upper portion of the contact 31c; the diameter of the portion of the third level from the top of the contact 31d is substantially equal to the diameters of the intermediate portion of the contact 31c and the upper portion of the contact 31b; and the diameter of the lower end portion of the contact 31d is substantially equal to the diameters of the lower portion of the contact 31c, the lower portion of the contact 31b, and the contact 31a. In other words, the surface areas of the lower ends of the contacts 31a to 31d are substantially equal to each other. The diameters of the contacts 31b to 31d change discontinuously to become finer downward.

A method for manufacturing the semiconductor memory device according to the first embodiment configured as described above will now be described.

FIGS. 2A to 2D, FIGS. 3A to 3D, FIGS. 4A to 4D, and FIGS. 5A to 5D are cross-sectional views of processes, illustrating the method for manufacturing the semiconductor memory device according to the first embodiment.

FIGS. 2A to 2D illustrate the central portion 15a of the stacked body 15; and FIGS. 3A to 5D illustrate the end portion 15b of the stacked body 15. The silicon substrate 11, the insulating film 12, and the back gate electrode film 13 are not illustrated in FIGS. 3A to 5D.

First, as illustrated in FIG. 2A, the insulating film 12 is formed on the silicon substrate 11; and the back gate electrode film 13 is formed thereon. Then, the recesses 22 are made in multiple regions of the upper surface of the back gate electrode film 13. Continuing, a sacrificial member 41 is filled into the recesses 22. Then, the insulating film 14 is formed on the back gate electrode film 13. Continuing, the stacked body 15 is constructed by stacking multiple electrode films 16 and multiple insulating films 17, e.g., four of each. Then, the multiple memory holes 21 extending in the Z direction are made in the central portion 15a of the stacked body 15. The memory holes 21 are arranged in a matrix configuration as viewed from the Z direction; and two of the memory holes 21 adjacent to each other in the Y direction communicate with two end portions of the recess 22. Thereby, the U-shaped hole 23 is made.

Figure 2B:
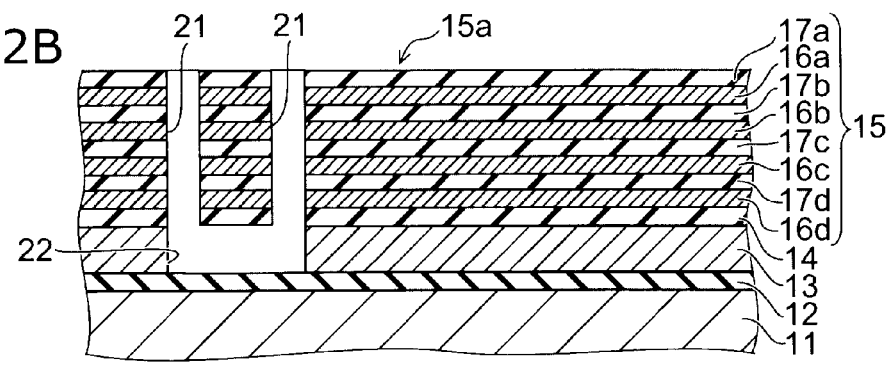

Then, as illustrated in FIG. 2B, the sacrificial member 41 is removed from inside the recess 22 by performing wet etching via the memory holes 21.

Figure 2C:
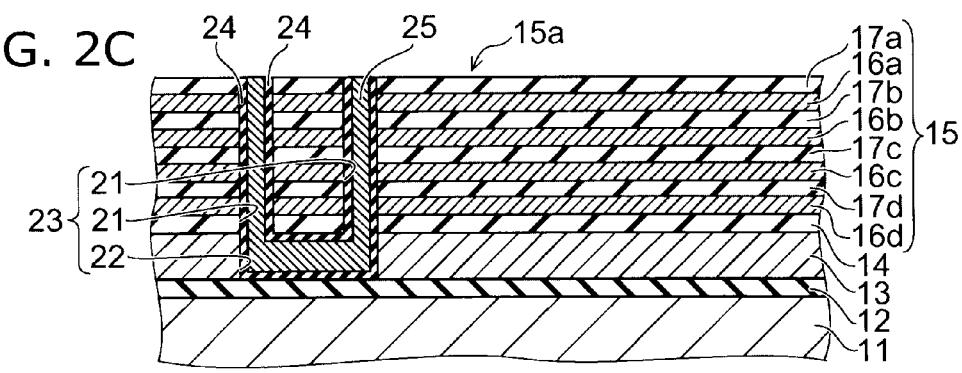

Continuing as illustrated in FIG. 2C, the memory film 24 is formed by forming the blocking layer, the charge storage layer, and the tunneling layer in this order on the inner surface of the U-shaped hole 23. Then, the semiconductor member 25 is formed by filling a semiconductor material, e.g., polysilicon, into the U-shaped hole 23.

Figure 2D:
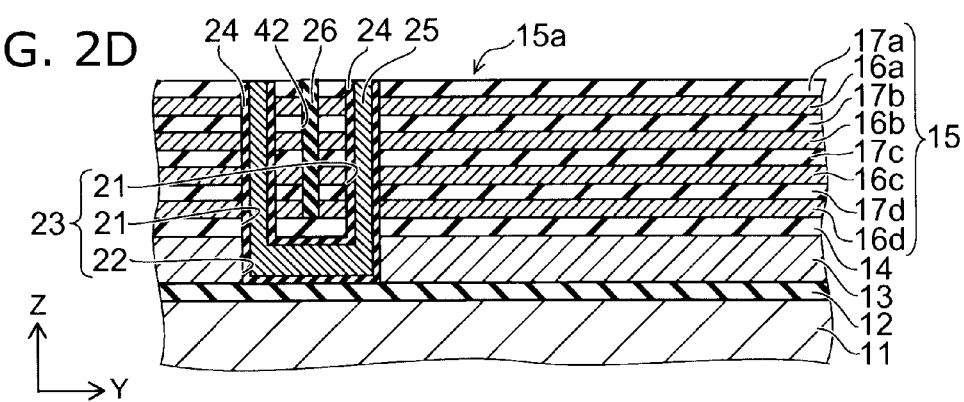

Then, as illustrated in FIG. 2D, a slit 42 extending in the X direction is made in the stacked body 15 in a region directly above the Y-direction central portion of the recess 22 to pierce the stacked body 15. Thereby, each of the electrode films 16 is divided in the Y direction. Then, the insulating plate 26 is formed by filling an insulating material into the slit 42.

Figure 3A:
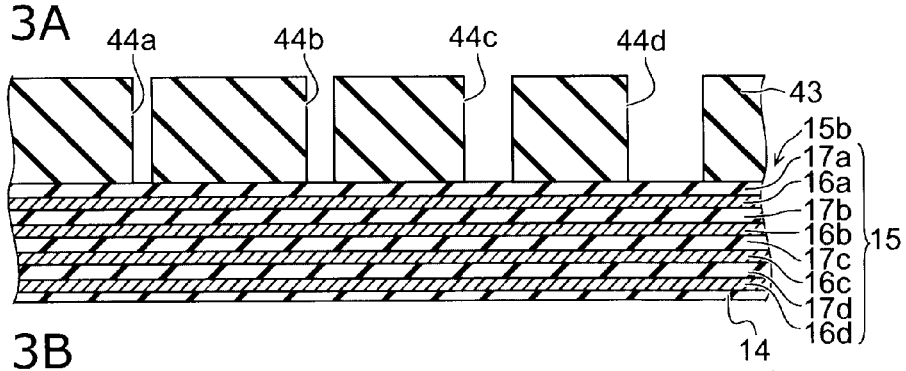

Continuing as illustrated in FIG. 3A, a hard mask 43 is formed by depositing, for example, silicon oxide on the stacked body 15. Then, the hard mask 43 is patterned using lithography and dry etching. Thereby, multiple, e.g., four, holes 44 piercing the hard mask 43 in the thickness direction are made in a region directly above the end portion 15b of the stacked body 15. The configuration of the hole 44 is, for example, circular as viewed from the Z direction. The sizes, e.g., the diameters, of the holes 44 are different from each other. Hereinbelow, the four holes 44 also are called the holes 44a, 44b, 44c, and 44d in order of proximity to the central portion 15a of the stacked body 15 (referring to FIG. 2A to 2D). The diameters of the holes 44 increase in the order of the holes 44a, 44b, 44c, and 44d. In other words, the hole 44a is the smallest; and the hole 44d is the largest.

Then, deposition of a mask material 45, etch-back of the mask material 45, and etching using the mask material 45 and the hard mask 43 as a mask are performed repeatedly. These processes are implemented continuously inside an RIE apparatus.

Figure 3B:
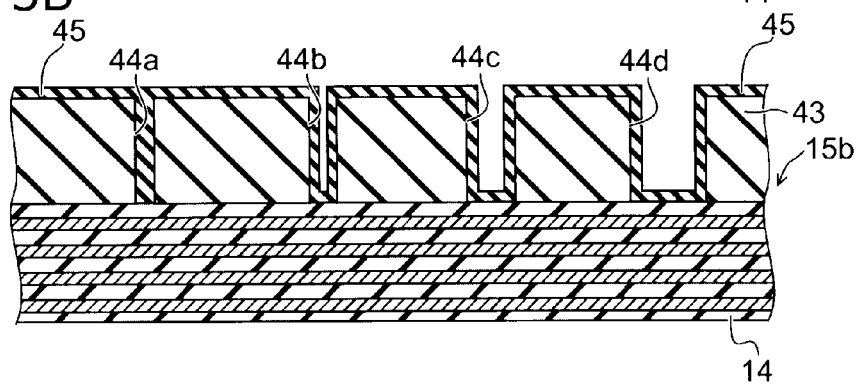

Namely, as illustrated in FIG. 3B, the mask material 45 is deposited on the entire surface. It is sufficient for the mask material 45 to be a material that provides etching selectivity with the hard mask 43; and silicon nitride or silicon carbide, for example, may be used. Thereby, a layer made of the mask material 45 is formed on the bottom surface and on the side surface of the holes 44. At this time, the hole 44a which is the smallest hole is plugged by its entire interior being filled with the mask material 45.

Figure 3C:
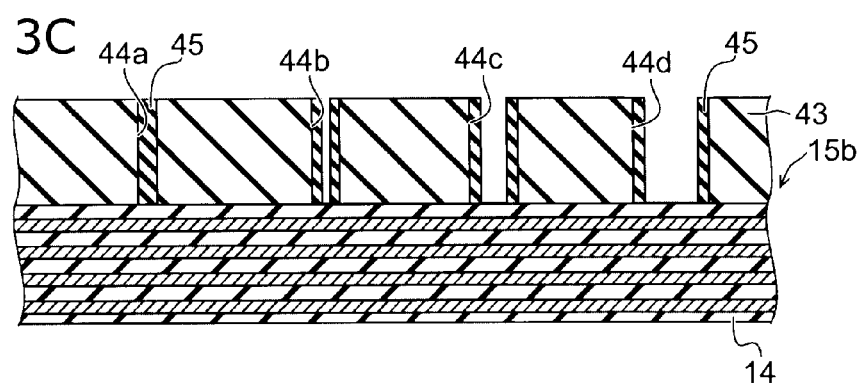

Then, as illustrated in FIG. 3C, etch-back of the mask material 45 is performed. Thereby, the mask material 45 is removed from the bottom surfaces of the holes 44b, 44c, and 44d. However, the mask material 45 remains on the side surfaces of the holes 44b, 44c, and 44d. As a result, the inner diameters of the holes 44b, 44c, and 44d are reduced. On the other hand, the mask material 45 filled into the hole 44a is substantially not removed. Accordingly, the hole 44a remains plugged.

Figure 3D:
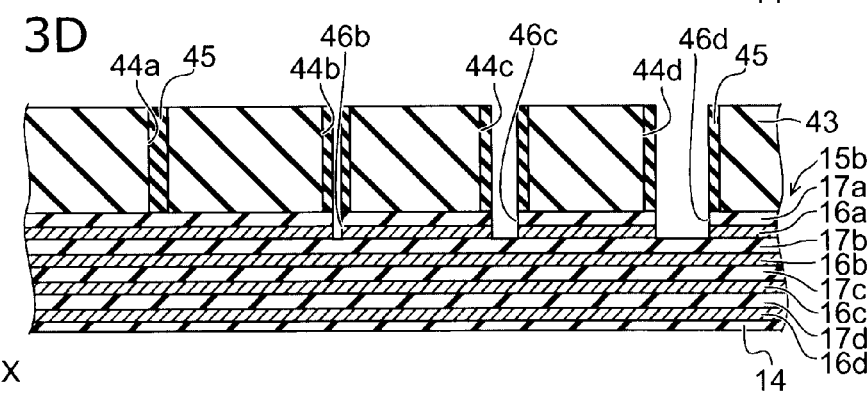

Then, as illustrated in FIG. 3D, one level of the insulating films 17 and one level of the electrode films 16 are etched by performing anisotropic etching such as RIE (reactive ion etching), etc., using the mask material 45 and the hard mask 43 as a mask. Thereby, the portions of the insulating film 17a and the electrode film 16a of the uppermost level of the stacked body 15 corresponding to the regions directly under the holes 44b, 44c, and 44d are removed. As a result, contact holes 46b, 46c, and 46d are made in the regions directly under the holes 44b, 44c, and 44d respectively. The contact holes 46b, 46c, and 46d pierce the insulating film 17a and the electrode film 16a of the uppermost layer to reach the insulating film 17b of the second level from the top. On the other hand, the region directly under the hole 44a is not etched because the hole 44a is filled with the mask material 45.

Figure 4A:
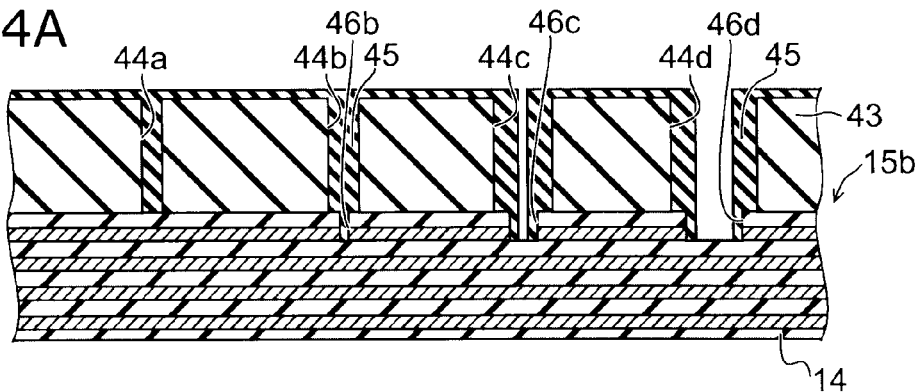

Continuing as illustrated in FIG. 4A, the mask material 45 is deposited. Thereby, the interior of the hole 44b, which is the smallest hole of the open holes 44, is plugged by being filled with the mask material 45. The mask material 45 remains on the side surfaces of the holes 44c and 44d; and the inner diameters of the holes 44c and 44d become even smaller. Then, the mask material 45 is removed from the bottom surfaces of the contact holes 46c and 46d by performing etch-back on the mask material 45.

Figure 4B:
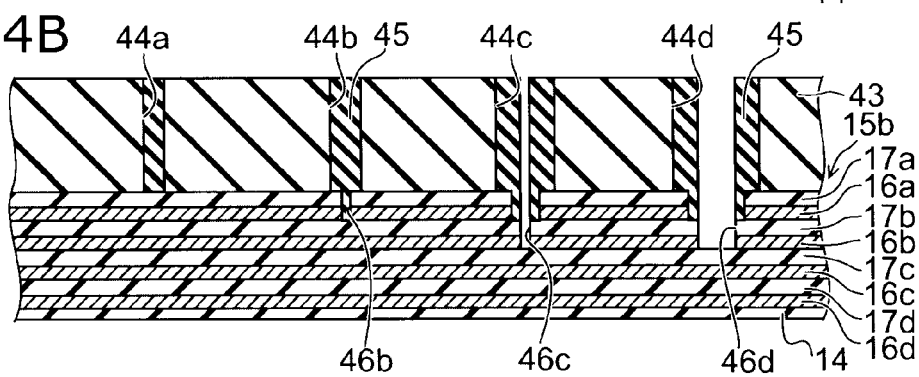

Then, as illustrated in FIG. 4B, one level of the insulating films 17 and one level of the electrode films 16 are etched by performing etching such as RIE, etc., using the mask material 45 and the hard mask 43 as a mask. Thereby, the insulating film 17b and the electrode film 16b of the second level are removed from the regions directly under the open holes 44c and 44d. As a result, the contact holes 46c and 46d extend downward to pierce the insulating film 17b and the electrode film 16b to reach the insulating film 17c of the third level. The regions directly under the holes 44a and 44b are not etched because the holes 44a and 44b are filled with the mask material 45. Therefore, the contact hole 46b does not extend downward; and the configuration thereof is maintained.

Figure 4C:
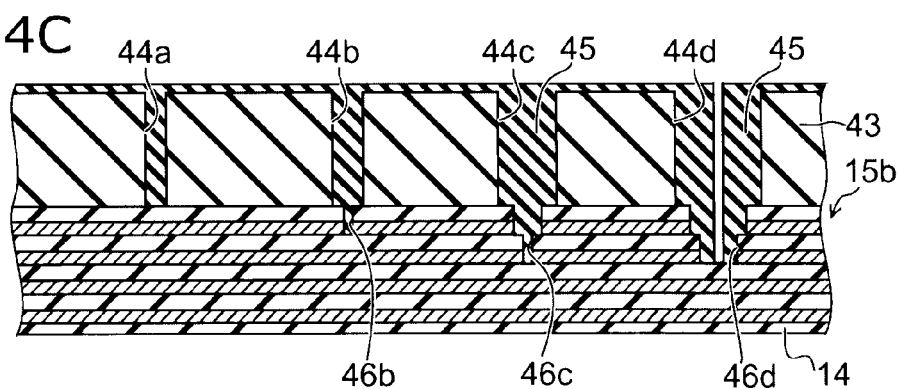

Continuing as illustrated in FIG. 4C, the mask material 45 is deposited; and subsequently, etch-back is performed. Thereby, the interior of the hole 44c, which is the smallest hole of the open holes 44, is plugged by being filled with the mask material 45. The mask material 45 remains on the side surface of the hole 44d; and the inner diameter of the hole 44d becomes even smaller.

Figure 4D:
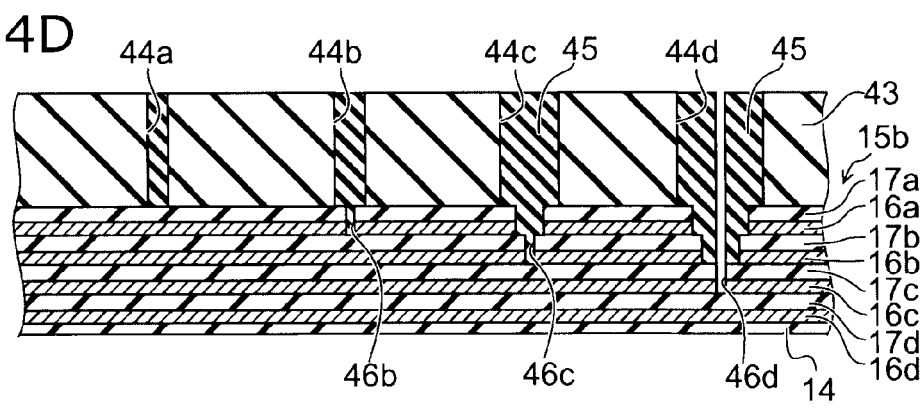

Then, as illustrated in FIG. 4D, one level of the insulating films 17 and one level of the electrode films 16 are etched by performing etching such as RIE, etc., using the mask material 45 and the hard mask 43 as a mask. Thereby, the insulating film 17c and the electrode film 16c of the third level from the top are removed from the region directly under the open hole 44d. As a result, the contact hole 46d made in the region directly under the hole 44d extends downward to pierce the insulating film 17c and the electrode film 16c to reach the insulating film 17d of the fourth level from the top. The regions directly under the holes 44a, 44b, and 44c are not etched because the holes 44a, 44b, and 44c are filled with the mask material 45.

Continuing as illustrated in FIG. 5A, the mask material 45 (referring to FIG. 4A to 4D) is removed. Thus, the contact hole 46b piercing the insulating film 17a and the electrode film 16a is made in the region directly under the hole 44b; the contact hole 46c piercing the portion from the insulating film 17a to the electrode film 16b is made in the region directly under the hole 44c; and the contact hole 46d piercing the portion from the insulating film 17a to the electrode film 16c is made in the region directly under the hole 44d. The diameters of the contact holes 46b, 46c, and 46d become smaller every time the electrode film 16 is pierced. On the other hand, although the mask material 45 filled into the hole 44a also is removed, a contact hole is not made in the region directly under the hole 44a.

Then, as illustrated in FIG. 5B, etching of silicon is performed via the holes 44 and the contact holes 46. This etching is isotropic etching such as, for example, wet etching, etc. Thereby, a gap 47 is made by removing one portion of each of the electrode films 16 from the starting point of each of the contact holes 46. In such a case, the region of the upper surface of each of the electrode films 16 where other electrode films 16 do not exist directly thereabove is used as the terrace 18. At this time, the electrode films 16 may remain at a portion between the gaps 47 to reliably prevent the collapse of the electrode films 16.

Continuing as illustrated in FIG. 5C, an insulating material 48 such as silicon oxide, etc., is deposited using, for example, ALD (atomic layer deposition). At this time, the insulating material 48 is filled into the gap 47 by adhering the insulating material 48 to the upper surface and the lower surface of the insulating film 17. The inter-layer insulating film 19 is formed of the insulating material 48 and the insulating film 17 disposed therebetween.

Then, as illustrated in FIG. 5D, the insulating films 17 at the bottom surface of the hole 44a and the bottom surfaces of the contact holes 46b, 46c, and 46d are removed by etching. Thereby, the electrode films 16 are exposed at the bottom surfaces of the contact holes 46 respectively. Then, a conductive material, e.g., a metal material, is filled into the holes 44a to 44d and the contact holes 46b to 46d. Thereby, the contacts 31 are formed inside the holes 44 and the contact holes 46. More specifically, the contact 31a is formed inside the hole 44a; the contact 31b is formed inside the hole 44b and inside the contact hole 46b; the contact 31 is formed inside the hole 44c and inside the contact hole 46c; and the contact 31d is formed inside the hole 44d and inside the contact hole 46d. The hard mask 43 is used as the upper layer insulating film 20.

Continuing, the selection gate electrodes, the source lines, and the bit lines (each of these is not illustrated) are formed above the upper layer insulating film 20 (the hard mask 43) using normal methods. The multiple word interconnects (not illustrated) are formed to connect to the upper ends of the contacts 31 respectively. Thereby, the semiconductor memory device 1 according to the embodiment is manufactured.

Effects of the embodiment will now be described.

According to the embodiment, the formation of the contacts 31 and the patterning of the end portion 15b of the stacked body 15 can be performed simultaneously. Thereby, the number of processes when manufacturing the semiconductor memory device 1 can be reduced; and the manufacturing cost can be reduced. Further, the positional relationship between the terrace 18 and the contact 31 does not shift because the terrace 18 can be formed self-aligningly with the contact 31. Thereby, the contacts 31 can be reliably connected to the electrode films 16.

A comparative example of the embodiment will now be described.

FIGS. 6A to 6D are cross-sectional views of processes, illustrating a method for manufacturing a semiconductor memory device according to the comparative example.

First, in the comparative example as illustrated in FIGS. 2A to 2D, the stacked body 15 is formed on the silicon substrate 11; the U-shaped hole 23 is made in the central portion 15a of the stacked body 15; the memory film 24 is formed on the inner surface thereof; and the semiconductor member 25 is filled into the interior thereof.

Figure 6A:
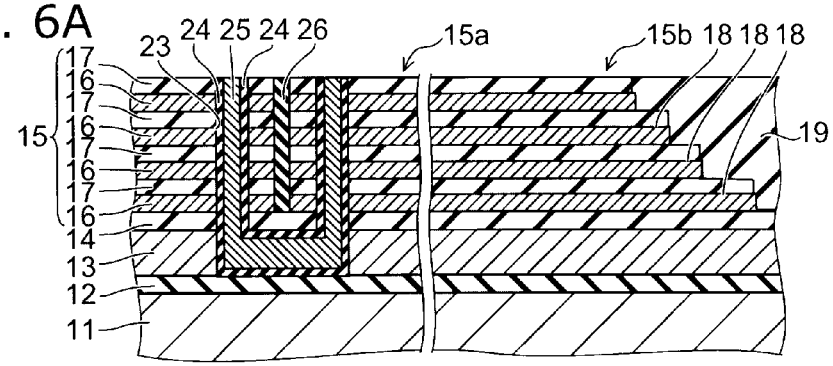
FIGS. 6A to 6D are cross-sectional views of processes, illustrating a method for manufacturing a semiconductor memory device according to a comparative example.
Figure 6B:
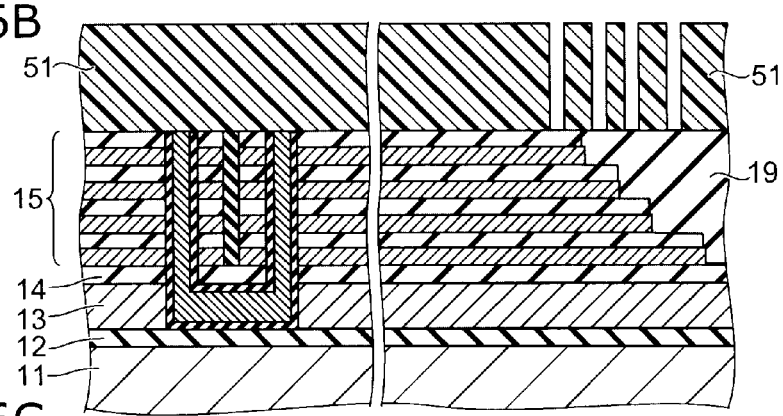
Figure 6C:
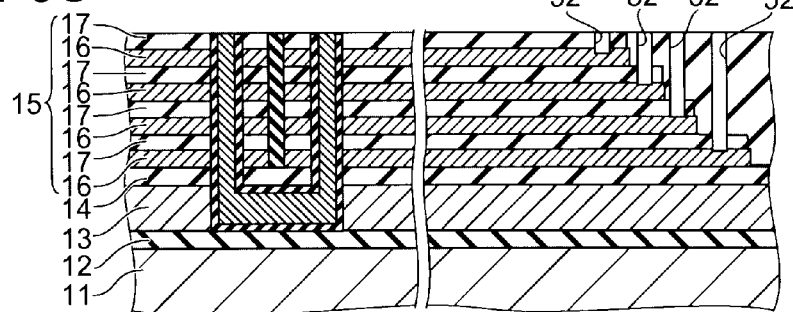
Figure 6D:
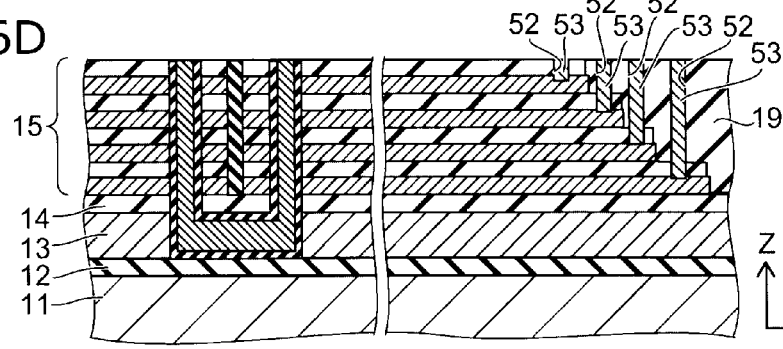

Then, as illustrated in FIG. 6A, the terrace 18 is formed for each of the electrode films 16 by patterning the end portion 15b of the stacked body 15 into a stairstep configuration. Then, the end portion 15b is buried in the inter-layer insulating film 19. Continuing as illustrated in FIG. 6B, a resist pattern 51 is formed on the stacked body 15 and the inter-layer insulating film 19. Then, as illustrated in FIG. 6C, a contact hole 52 is made in the inter-layer insulating film 19 for each of the regions directly above the terraces 18 by performing etching using the resist pattern 51 as a mask. Continuing, the resist pattern 51 is removed. Then, as illustrated in FIG. 6D, a contact 53 is formed by filling a conductive material into the contact hole 52.

In the process illustrated in FIG. 6A in the comparative example, the end portion 15b of the stacked body 15 is patterned into a stairstep configuration and re-buried in the inter-layer insulating film 19. Then, in the processes illustrated in FIGS. 6B and 6C, the contact holes 52 are newly made in the inter-layer insulating film 19. Therefore, in addition to the lithography process for making the contact holes 52, a lithography process for patterning the end portion 15b is necessary; and the manufacturing cost of the semiconductor memory device increases. Moreover, there is a possibility that the positions may shift between the terraces 18 and the contacts 53 because the process of forming the terraces 18 by patterning the end portion 15b and the process of making the contact holes 52 by patterning the inter-layer insulating film 19 are implemented independently. Conversely, according to the first embodiment described above, the manufacturing cost of the semiconductor memory device 1 can be kept low and the positional shifting does not occur because the patterning of the end portion 15b is performed simultaneously with the formation of the contact holes 46.

A second embodiment will now be described.

Figure 7:
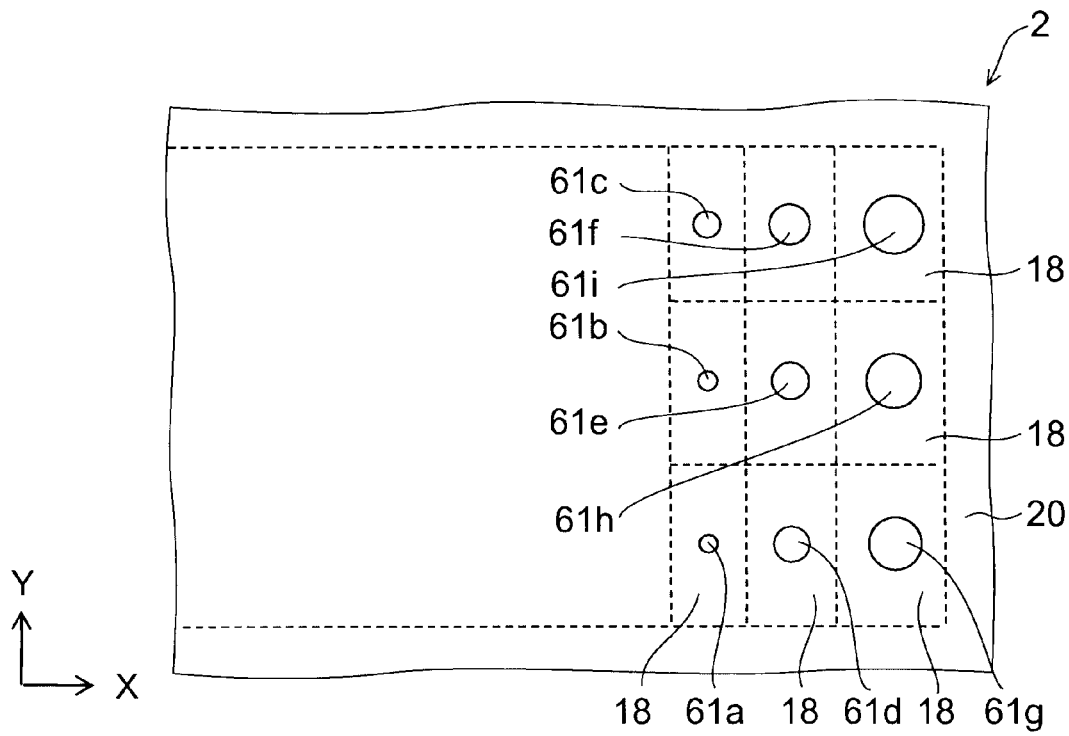
FIG. 7 is a plan view illustrating a semiconductor memory device according to a second embodiment.

FIG. 7 is a plan view illustrating a semiconductor memory device according to the second embodiment.

Figure 8:
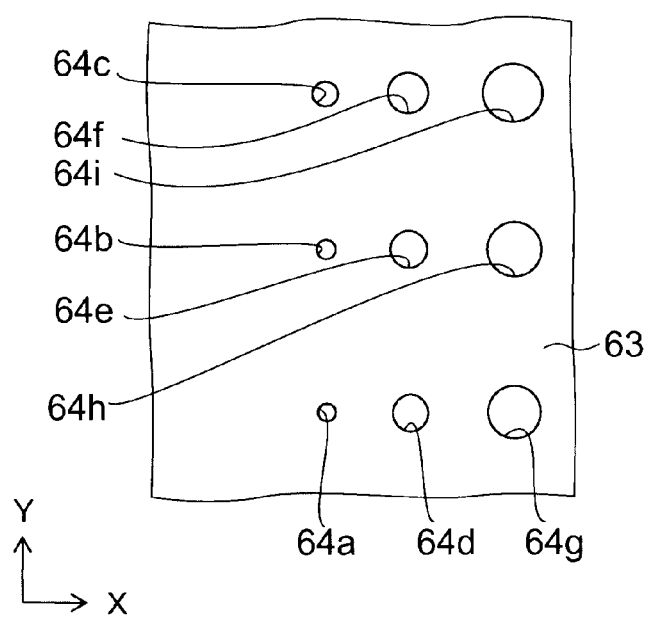
FIG. 8 is a process plan view illustrating a method for manufacturing the semiconductor memory device according to the second embodiment.

FIG. 8 is a process plan view illustrating a method for manufacturing the semiconductor memory device according to the second embodiment.

As illustrated in FIG. 7, the semiconductor memory device 2 according to the embodiment differs from the semiconductor memory device 1 according to the first embodiment described above (referring to FIG. 1A and 1B) in that there are nine electrode films 16, and the terraces 18 are arranged in a chessboard-like configuration as viewed from the Z direction.

In other words, in the semiconductor memory device 2, for example, nine of the electrode films 16 (referring to FIG. 1A and 1B) and nine of the insulating film 17 (referring to FIG. 1A and 1B) are stacked in the stacked bodies 15. In the end portion 15b of the stacked body 15, the terraces 18 are arranged in three rows and three columns along the X direction and the Y direction. Then, contacts 61a to 61i are connected to the terraces 18 respectively. The diameters of the upper end portions of the contacts 61a to 61i are different from each other; the contact 61a is the finest; the diameters of the contacts 61a, 61b, 61c, 61d, 61e, 61f, 61g, 61h, and 61i increase in this order; and the diameter of the contact 61i is the largest. For the contacts 61 arranged in one column along the X direction, the diameter of the upper end portion increases and the contact 61 is connected to an electrode film 16 of a lower level as the contact 61 is distal to the central portion 15a. The diameters of the lower end portions of the contacts 61a to 61i are substantially equal to each other.

A method for manufacturing the semiconductor memory device according to the embodiment will now be described.

In the process of forming a hard mask 63 as illustrated in FIG. 3A in the embodiment, holes 64a to 64i are arranged in a matrix configuration of three rows and three columns as viewed from the Z direction as illustrated in FIG. 8. In such a case, the sizes of the holes 64a to 64i are different from each other. In other words, the hole 64a is made to be the smallest; the holes 64a, 64b, 64c, 64d, 64e, 64f, 64g, 64h, and 64i are larger in this order; and the hole 64i is made to be the largest.

Then, using processes similar to the processes illustrated in FIG. 3B to FIG. 5A, the deposition of the mask material 45 (referring to FIG. 3A to 3D) and the etching using the mask material 45 and the hard mask 63 as a mask are repeated, for example, eight times. In such a case, contact holes are made in the regions directly under the holes 64b to 64i by the first etching; and the contact holes are extended downward by the subsequent seven etchings. Thereby, the smaller holes 64 are plugged in order with the mask material 45; and deeper contact holes are made in the regions directly under the larger holes 64. Then, similarly to the process illustrated in FIG. 5B, isotropic etching is performed via the contact holes. Thereby, the terraces 18 are formed self-aligningly with respect to the contact holes by removing one portion of each of the electrode films 16. Then, similarly to the process illustrated in FIG. 5C, the gap 47 between the insulating films 17 is filled with the insulating material 48. Then, similarly to the process illustrated in FIG. 5D, a conductive material is filled into the contact holes and the holes 64. Thereby, the contacts 61a to 61i are formed inside the holes 64a to 64i and inside the contact holes directly thereunder respectively. Thus, the semiconductor memory device 2 according to the embodiment is manufactured.

According to the embodiment, downsizing of the semiconductor memory device 2 can be realized because the terraces 18 and the contacts 31 are arranged in a matrix configuration. Otherwise, the configuration, the manufacturing method, and the effects of the embodiment are similar to those of the first embodiment described above.

A third embodiment will now be described.

Figure 9:
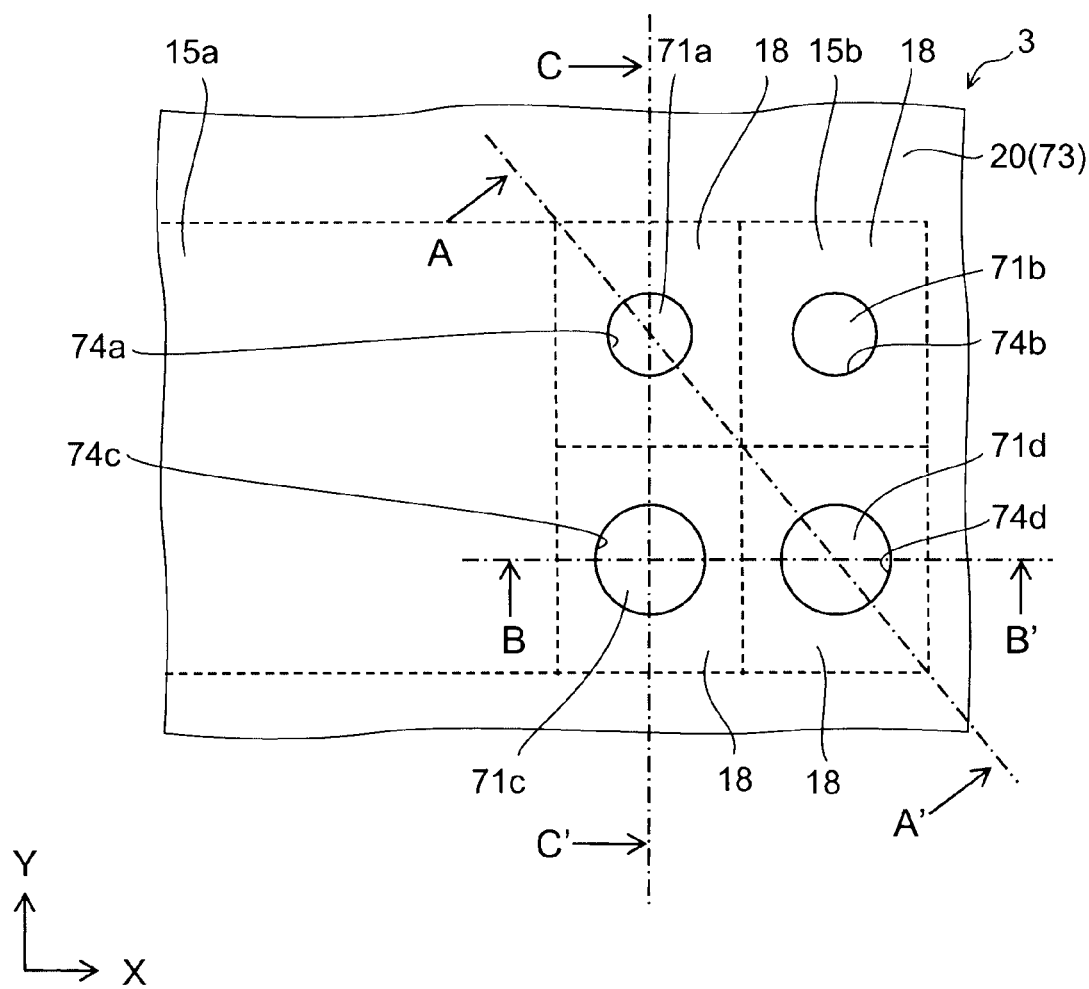
FIG. 9 is a plan view illustrating a semiconductor memory device according to a third embodiment.

FIG. 9 is a plan view illustrating a semiconductor memory device according to the third embodiment.

FIGS. 10A to 10C are cross-sectional views illustrating the semiconductor memory device according to the third embodiment. FIG. 10A is a cross-sectional view along line A-A' of FIG. 9; FIG. 10B is a cross-sectional view along line B-B' of FIG. 9; and FIG. 10C is a cross-sectional view along line C-C' of FIG. 9.

As illustrated in FIG. 9 and FIGS. 10A to 10C, the semiconductor memory device 3 according to the third embodiment differs from the semiconductor memory device 1 according to the first embodiment described above in that the terraces 18 are arranged in a chessboard-like configuration having two rows and two columns; contacts 71 also are arranged in a matrix configuration having two rows and two columns; and the diameters of the upper end portions of the contacts 71 have only two levels.

In other words, in the semiconductor memory device 3, four contacts 71a to 71d are formed. The contact 71a is connected to the electrode film 16a of the highest level of the stacked body 15; the contact 71b is connected to the electrode film 16b of the second level from the top; the contact 71c is connected to the electrode film 16c of the third level from the top; and the contact 71d is connected to the electrode film 16d of the fourth level from the top, i.e., the lowermost level. As viewed from the Z direction, the contacts 71a and 71b are arranged in one column along the X direction; and the contact 71b is disposed at a position more distal to the central portion 15a of the stacked body 15 than is the contact 71a. The contacts 71c and 71d are arranged in one column along the X direction; and the contact 71d is disposed at a position more distal to the central portion 15a than is the contact 71c. The diameters of the upper end portions of the contacts 71c and 71d are larger than the diameters of the upper end portions of the contacts 71a and 71b. The diameter of the upper end portion of the contact 71c is substantially equal to the diameter of the upper end portion of the contact 71d; and the diameter of the upper end portion of the contact 71a is substantially equal to the diameter of the upper end portion of the contact 71b. The diameters of the lower end portions of the contacts 71a to 71d are substantially equal to each other.

In other words, the arrangement number m of the contacts 71 in the Y direction (the first direction) is 2; and the arrangement number n of the contacts 71 in the X direction (the second direction) is 2. The diameters of the upper end portions of the contacts 71 arranged along the Y direction are different from each other. Here, (n−1) electrode films 16, i.e., one of the electrode films 16, is interposed between two of the electrode films 16 connected respectively to two of the contacts 71 adjacent to each other in the Y direction. Specifically, as illustrated in FIG. 10C, one of the electrode films 16b is interposed between the electrode film 16a to which the contact 71a is connected and the electrode film 16c to which the contact 71c is connected. Further, two of the electrode films 16 connected respectively to two of the contacts 71 adjacent to each other in the X direction are adjacent in the Z direction (the stacking direction). Specifically, as illustrated in FIG. 10B, the electrode film 16c to which the contact 71c is connected and the electrode film 16d to which the contact 71d is connected are adjacent in the Z direction.

A method for manufacturing the semiconductor memory device according to the third embodiment will now be described.

FIGS. 11A to 11C, FIGS. 12A to 12C, FIGS. 13A to 13C, FIGS. 14A to 14C, and FIGS. 15A to 15C are cross-sectional views of processes, illustrating the method for manufacturing the semiconductor memory device according to the third embodiment. In each of the drawings, drawing A corresponds to the cross section along line A-A' illustrated in FIG. 9; drawing B corresponds to the cross section along line B-B' illustrated in FIG. 9; and drawing C corresponds to the cross section along line C-C' illustrated in FIG. 9.

FIG. 11A to FIG. 15C illustrate only the end portion of the stacked body. The silicon substrate 11, the insulating film 12, the back gate electrode film 13, and the insulating film 14 (referring to FIG. 10A to 10C) are not illustrated.

In the embodiment, four different contacts are made by patterning only the upper layer portion of the end portion 15b of the stacked body 15 into a stairstep configuration prior to the formation of the contact holes and by combining two levels of steps formed in the end portion 15b with holes having two types of sizes made in a hard mask.

The specifics will now be described.

First, by implementing the processes illustrated in FIGS. 2A to 2D similarly to the first embodiment described above, the stacked body 15 is formed on the silicon substrate 11; and the U-shaped hole 23, the memory film 24, the semiconductor member 25, and the insulating plate 26 are formed in the central portion 15a of the stacked body 15.

Figure 11A:
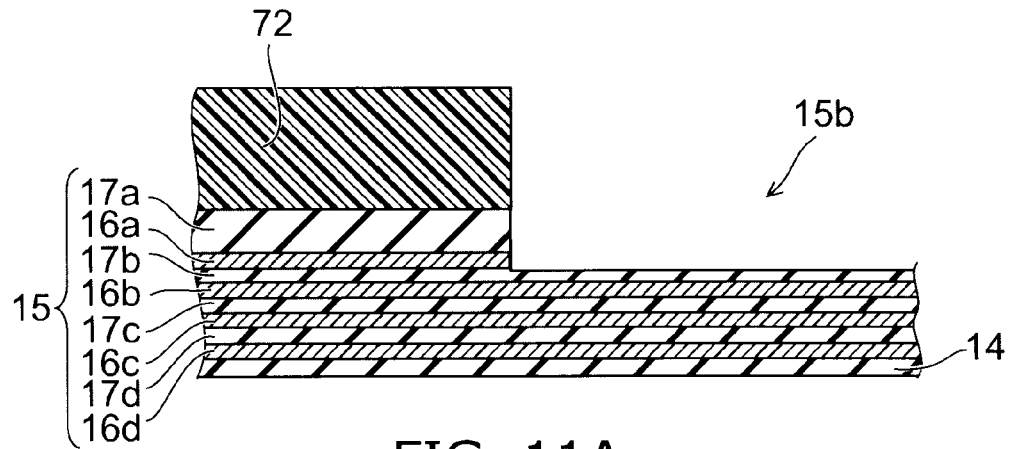
FIGS. 11A to 15C are cross-sectional views of processes, illustrating a method for manufacturing the semiconductor memory device according to the third embodiment.
Figure 11B:
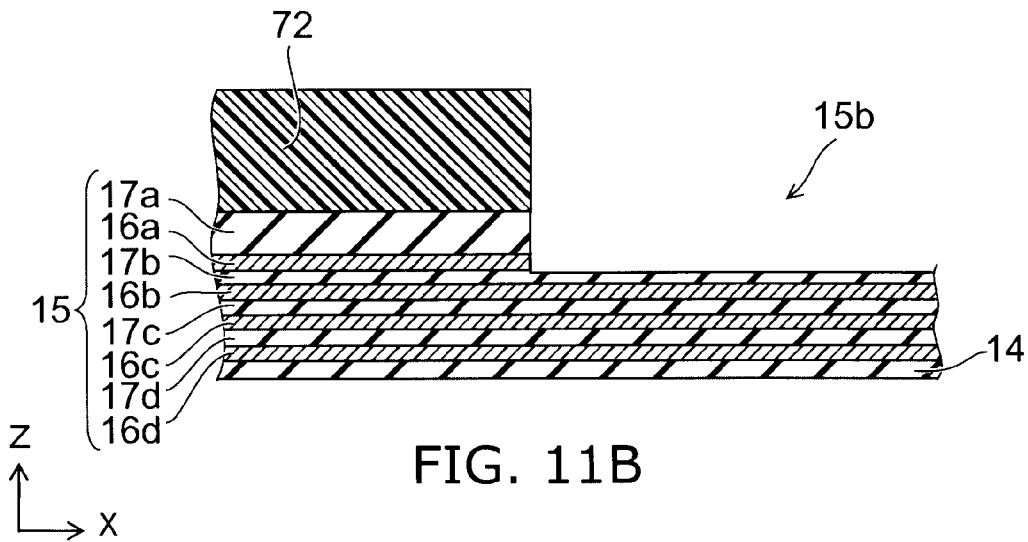
Figure 11C:
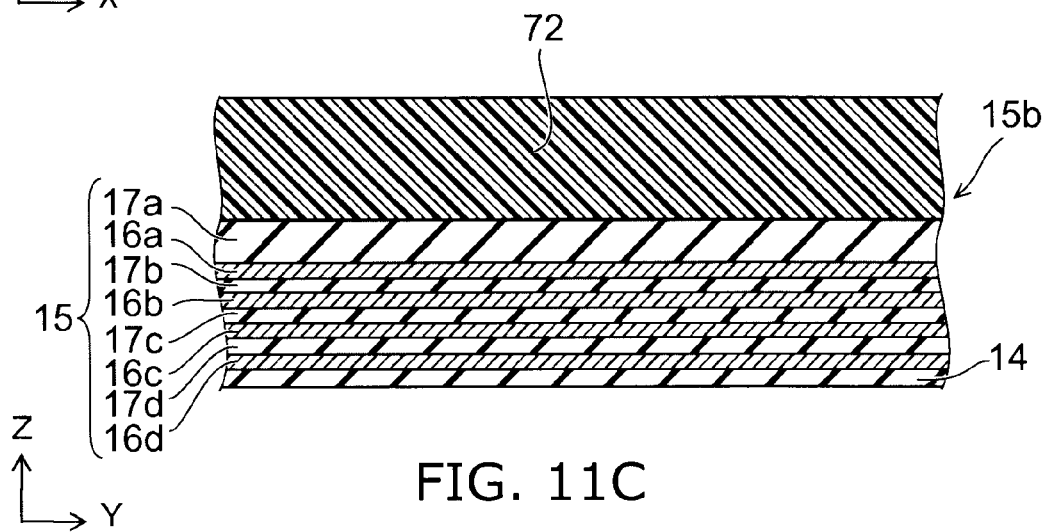

Then, as illustrated in FIGS. 11A to 11C, a resist film is coated onto the stacked body 15 and patterned using lithography. Thereby, a resist pattern 72 is formed to cover only the portion of the end portion 15b on the central portion 15a side. Then, etching is performed using the resist pattern 72 as a mask. Thereby, the insulating film 17a and the electrode film 16a of the uppermost level are removed at the portion of the end portion 15b on the side distal to the central portion 15a. As a result, two levels of steps are formed in the end portion 15b such that the number of the electrode films 16 decreases by one away from the central portion 15a. Subsequently, the resist pattern 72 is removed.

Figure 12A:
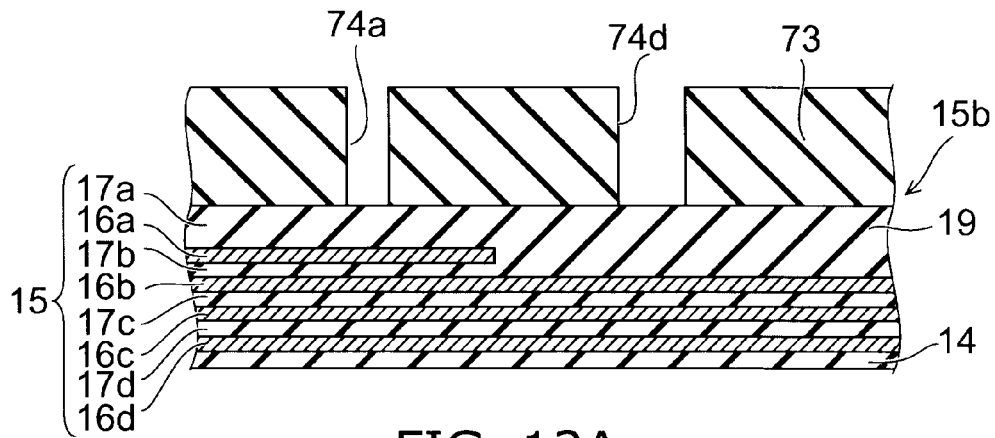
Figure 12B:
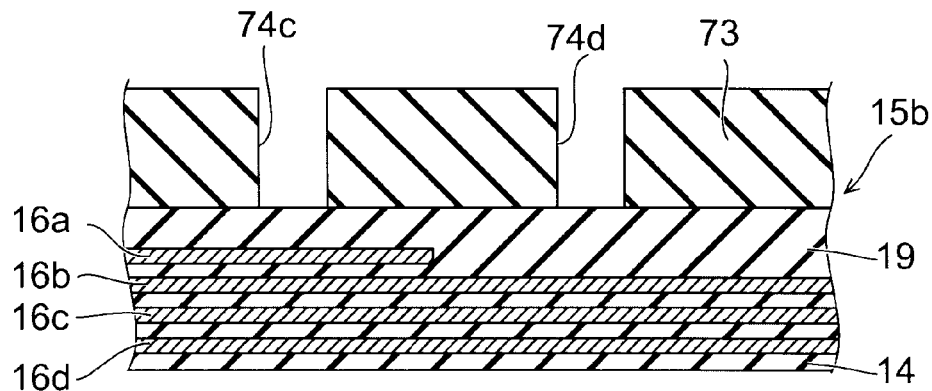
Figure 12C:
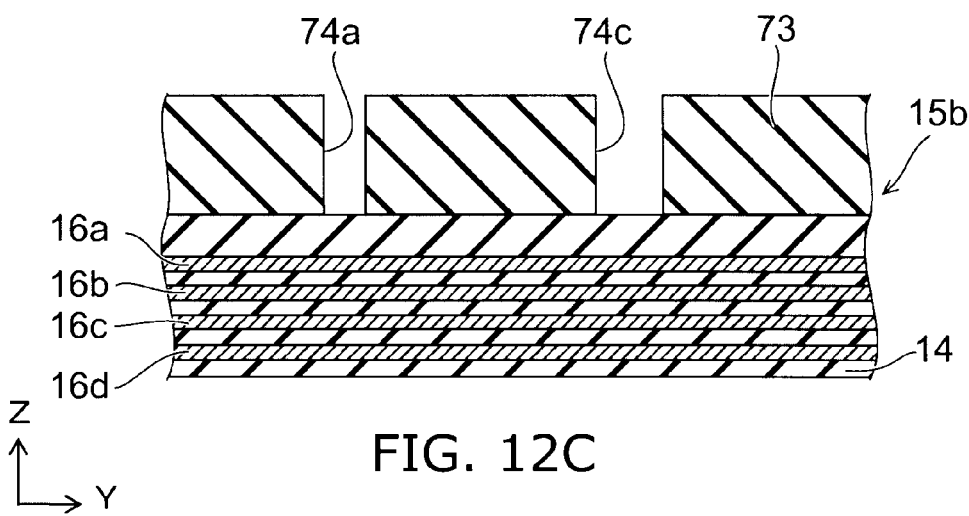

Continuing as illustrated in FIGS. 12A to 12C, the inter-layer insulating film 19 is formed to bury the end portion 15b of the stacked body 15; and the upper surface is planarized. Then, a hard mask 73 is formed on the stacked body 15 and the inter-layer insulating film 19; and four holes 74a to 74d are made in a matrix configuration by patterning. At this time, the multiple holes 74 having mutually different sizes are disposed respectively for the regions directly above the steps formed in the end portion 15b. Specifically, the holes 74a and 74c are made in the region where the electrode film 16a of the uppermost level remains; and the holes 74b and 74d are made in the region from which the electrode film 16a of the uppermost level is removed. The holes 74c and 74d are made to be larger than the holes 74a and 74b. The hole 74c and the hole 74d are the same size; and the hole 74a and the hole 74b are the same size.

Figure 13A:
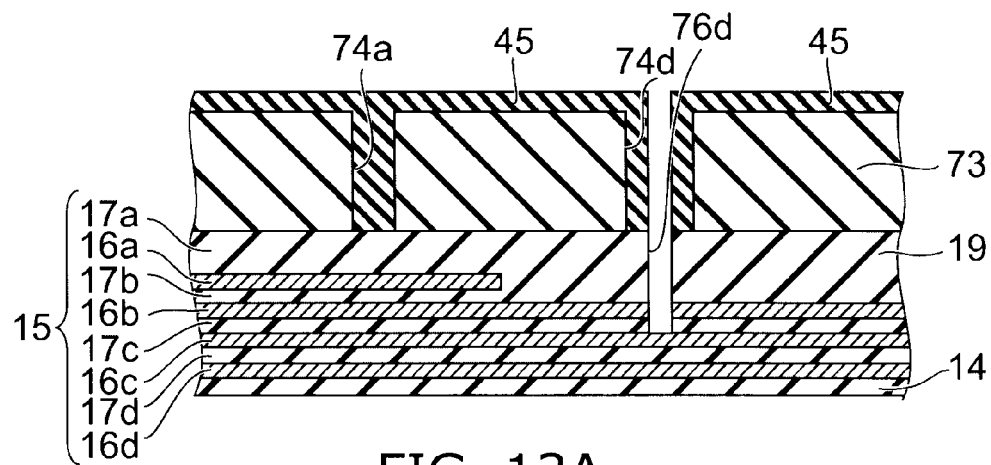
Figure 13B:
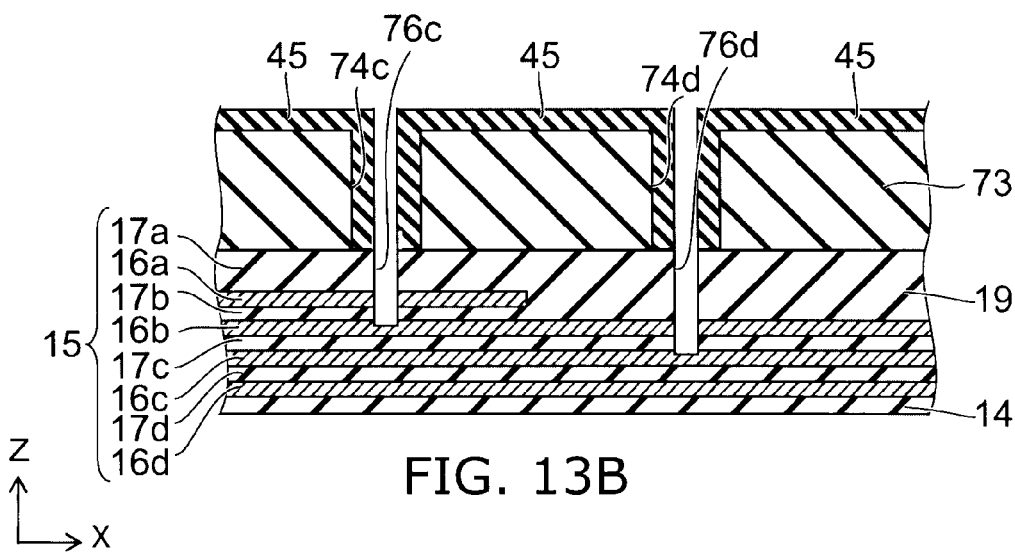
Figure 13C:
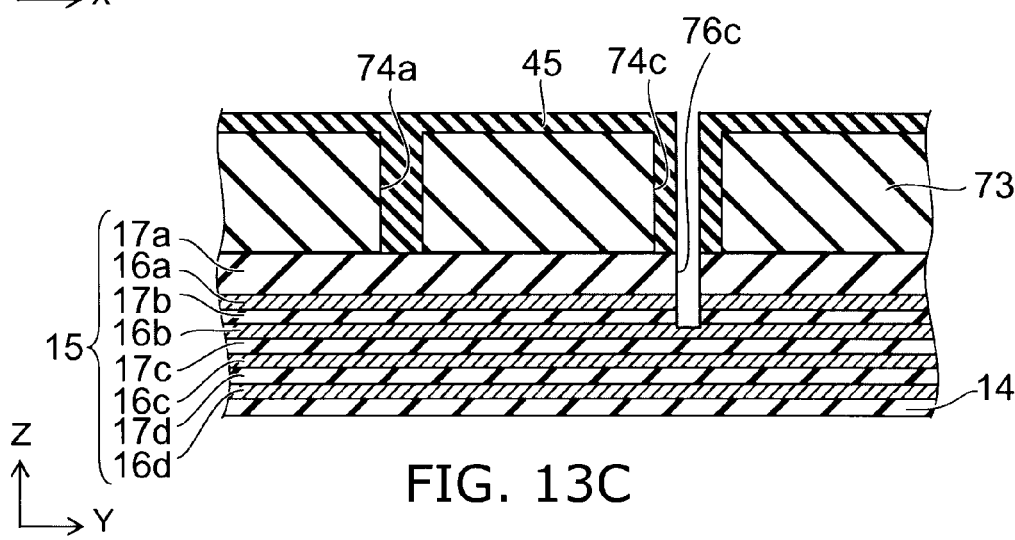

Then, as illustrated in FIGS. 13A to 13C, the mask material 45 is deposited; and etch-back is performed. Thereby, the relatively small holes 74a and 74b are plugged by the mask material 45. In the relatively large holes 74c and 74d, the mask material 45 is bonded to cover only the side surfaces; and the inner diameters are reduced. Then, anisotropic etching such as RIE, etc., is performed using the mask material 45 and the hard mask 73 as a mask. Thereby, the inter-layer insulating film 19, one level of the insulating films 17, and one level of the electrode films 16 are selectively removed in the regions directly under the relatively large holes 74c and 74d. As a result, a contact hole 76c is made in the region directly under the hole 74c to pierce the electrode film 16a to reach the electrode film 16b; and a contact hole 76d is made in the region directly under the hole 74d to pierce the electrode film 16b to reach the electrode film 16c. On the other hand, the regions directly under the relatively small holes 74a and 74b are not etched because the holes 74a and 74b are filled with the mask material 45. At this stage, the electrode film of the uppermost level in the region directly under the hole 74a is the electrode film 16a; and the electrode film of the uppermost level in the region directly under the hole 74b is the electrode film 16b. Subsequently, the mask material 45 is removed.

Figure 14A:
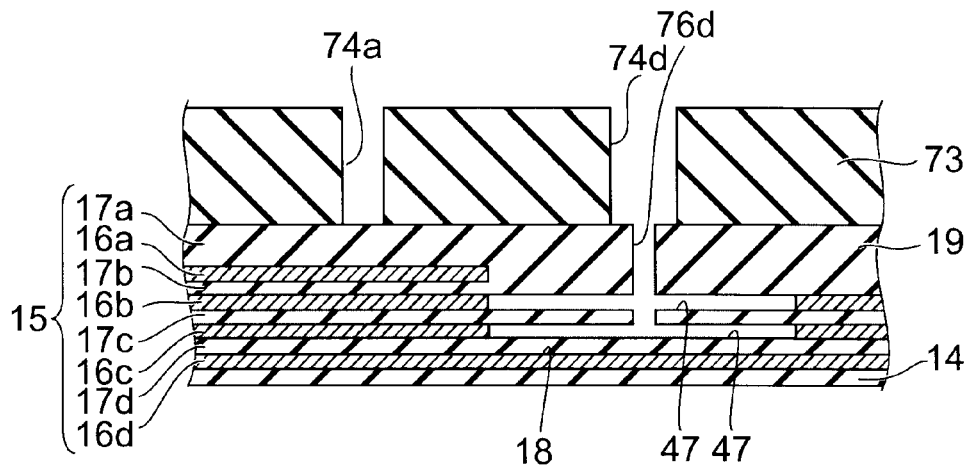
Figure 14B:
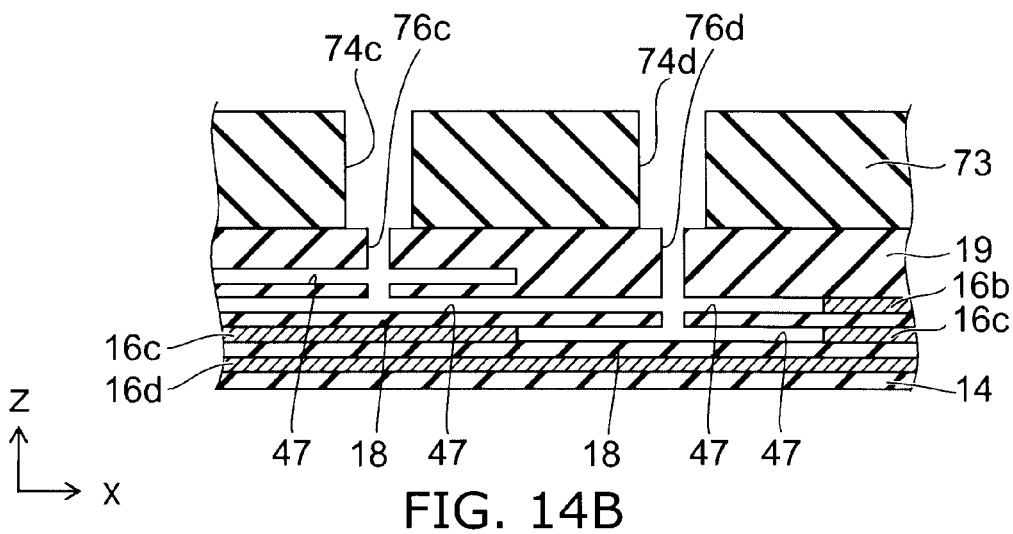
Figure 14C:
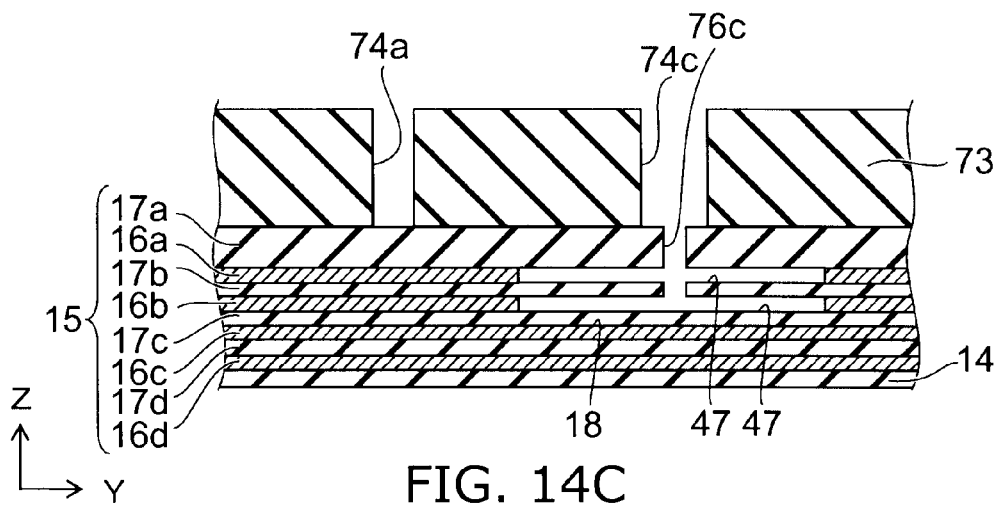

Continuing as illustrated in FIGS. 14A to 14C, isotropic etching is performed with conditions such that silicon is etched via the contact holes 76c and 76d. Thereby, one portion of the electrode film 16a and one portion of the electrode film 16b are removed from the starting point of the contact hole 76c. One portion of the electrode film 16b and one portion of the electrode film 16c are removed from the starting point of the contact hole 76d. As a result, the gap 47 forms between the insulating films 17. At this time, the region of the upper surface of the electrode film 16 where the other electrode films 16 are not disposed directly thereabove becomes the terrace 18. The upper surfaces of the electrode films 16 disposed in the regions directly under the holes 74a and 74b also become the terraces 18. Thereby, four terraces 18 are formed in a chessboard-like configuration having two rows and two columns.

Figure 15A:
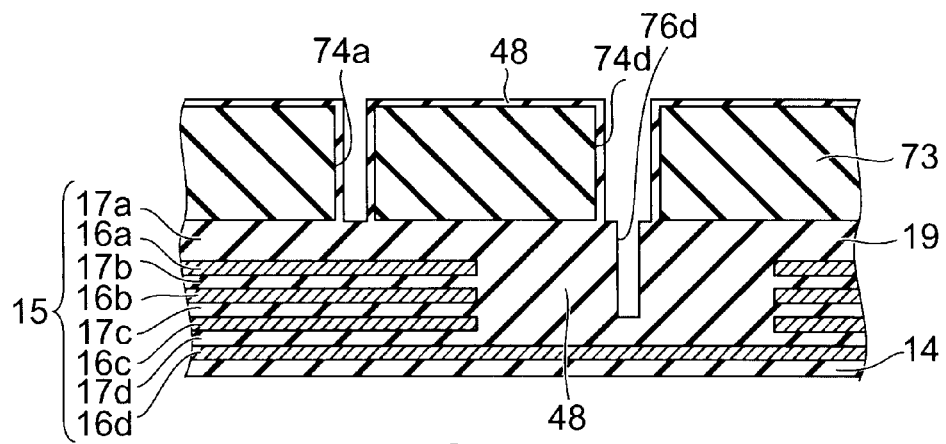
Figure 15B:
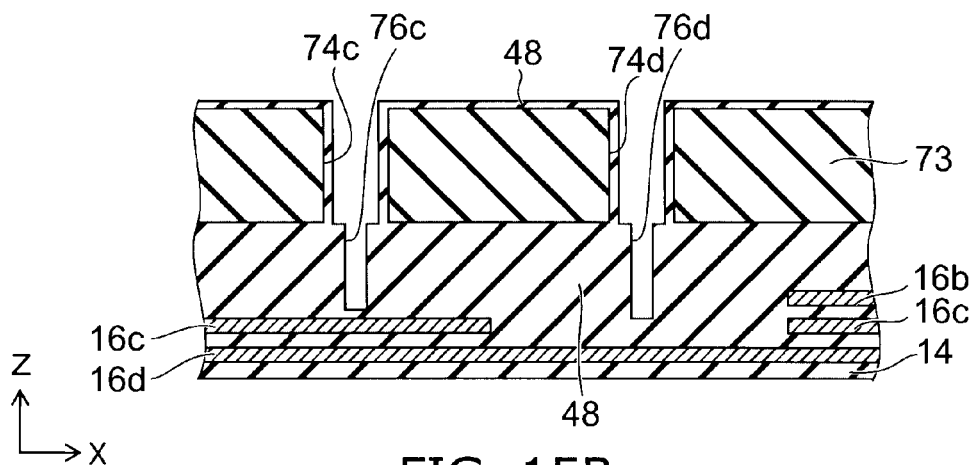
Figure 15C:
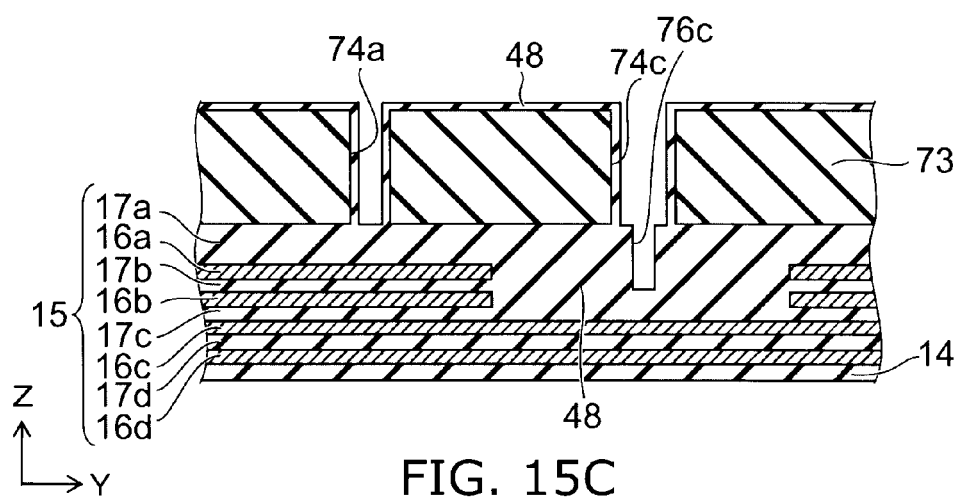

Then, as illustrated in FIGS. 15A to 15C, the gap 47 where the electrode films 16 are removed (referring to FIG. 14A to 14C) is refilled by depositing the insulating material 48 using, for example, ALD.

Continuing as illustrated in FIGS. 10A to 10C, the insulating material is removed from the bottom portions of the holes 74 and the contact holes 76 by performing etching. Thereby, a contact hole 76a is made in the region directly under the hole 74a to reach the electrode film 16a; and a contact hole 76b is made in the region directly under the hole 74b to reach the electrode film 16b. The contact hole 76c that reached the electrode film 16b is extended downward to reach the electrode film 16c; and the contact hole 76d that reached the electrode film 16c is extended downward to reach the electrode film 16d. Then, a conductive material is filled into the contact holes 76. Thereby, the contacts 71a to 71d are formed inside the contact holes 76a to 76d respectively. The subsequent processes are similar to those of the first embodiment described above. Thus, the semiconductor memory device 3 according to the embodiment is manufactured.

According to the embodiment, the semiconductor memory device 3 can be downsized even further because the terraces 18 and the contacts 71 are arranged in a matrix configuration. Four different types of the contacts 71a to 71d are made by forming two levels of steps along the X direction in the end portion 15b of the stacked body 15 and by making the holes 74 along the Y direction with two types of sizes. Thereby, there may be two types of sizes of the holes 74 made in the hard mask 73. In other words, although it is necessary to make the holes 44a to 44d in the hard mask 43 with four types of sizes to form the four types of the contacts 31a to 31d in the first embodiment described above, it is sufficient to use two types in the embodiment. Therefore, the lithography to make the holes 74 is easier. By reducing the number of sizes of the holes 74, the maximum size of the holes 74 can be kept small. Thereby, the surface area of the end portion 15b can be reduced.

In the embodiment, the end portion 15b of the stacked body 15 is patterned into a stairstep configuration and two levels of steps are formed in the processes illustrated in FIGS. 11A to 11C. Therefore, compared to the first embodiment described above, a lithography process is necessary for this patterning. However, compared to the case where four levels of steps are formed as in the comparative example described above (referring to FIG. 6A to 6D), a smaller number of lithography processes can be used.

Thus, according to the embodiment, the burden of the lithography of the entirety can be reduced by combining the technology for patterning the end portion 15b of the stacked body 15 into a stairstep configuration and the technology for providing the holes 74 with different sizes and plugging the holes with the mask material 45 in order from the smaller holes. As a result, the manufacturing cost of the semiconductor memory device can be reduced even further. Otherwise, the configuration, the manufacturing method, and the effects of the embodiment are similar to those of the first embodiment described above.

Although an example is illustrated in the third embodiment described above in which the terraces 18 are arranged in a chessboard-like configuration having two rows and two columns, the invention is not limited thereto. For example, the terraces 18 may be arranged in a chessboard-like configuration having three rows and three columns or four rows and four columns. The number of rows and the number of columns of the terraces 18 may be different from each other.

The third embodiment described above will now be described more generally.

In the semiconductor memory device according to the third embodiment, the multiple terraces are formed in a chessboard-like configuration in the end portion 15b of the stacked body 15. The number of stacks of the electrode films is (m×n), where the number of the terraces arranged in the Y direction is m and the number of the terraces arranged in the X direction is n. In such a case, the diameters of the upper end portions of the contacts arranged along the Y direction are different from each other; and the diameters of the lower end portions are substantially equal to each other. There are (n−1) electrode films 16 interposed between two of the electrode films 16 connected respectively to two of the contacts adjacent to each other in the Y direction; and two of the electrode films 16 connected respectively to two of the contacts adjacent to each other in the X direction are adjacent in the Z direction.

The method for manufacturing such a semiconductor memory device is as follows.

After forming the stacked body 15 on the silicon substrate 11, the end portion 15b is patterned into a stairstep configuration by selectively removing the electrode films 16 from the first level from the top to the (n−1)th level. In this process, the n levels of the steps are formed such that the number of the stacked electrode films 16 decreases one level at a time away from the central portion 15a of the stacked body 15. Then, the end portion 15b of the stacked body 15 is buried in the inter-layer insulating film 19; the upper surface is planarized; and a hard mask is formed thereon. The (n×m) holes are made in a matrix configuration in the hard mask by arranging the n holes respectively at the steps along the X direction and arranging the m holes along the Y direction. In such a case, the sizes of the m holes arranged along the Y direction are different from each other. The process of filling the smallest hole while making the other holes smaller by depositing a mask material and the process of making the contact holes or extending the contact holes downward by removing n levels of insulating films 17 and n levels of electrode films 16 at the regions directly below the open holes by performing etching using the mask material and the hard mask as a mask are repeated (m−1) times.

Thereof, the first process makes the contact holes; and the subsequent (m−2) processes extend the contact holes downward. Then, a gap is made by removing one portion of the electrode films by performing etching via the contact holes. Continuing, the gap is refilled by depositing an insulating material. Then, the insulating material is removed from the bottom surfaces of the contact holes; and the contacts are formed by filling a conductive material into the contact holes. Thus, the semiconductor memory device can be manufactured.

Thus, (m×n) types of contacts connected respectively to (m×n) electrode films 16 can be formed in the end portion 15b of the stacked body 15 by combining the technology for forming n levels of the steps along the X direction with the technology for making holes having m types of sizes in the hard mask to be arranged along the Y direction and performing etching while filling the holes with a mask material in order from the smaller holes. As a result, compared to the first embodiment described above, the lithography to make the holes is easier because the number of sizes of the holes can be reduced. Also, compared to the comparative example described above, the number of the lithography processes can be reduced because the number of levels of the steps can be reduced. Thereby, the burden of the lithography can be reduced for the entirety; and the manufacturing cost can be reduced. This effect is particularly beneficial when there are many stacks of the electrode films 16.

It is favorable for the value of the arrangement number n of the terraces in the X direction described above to be not less than the value of the arrangement number m of the terraces in the Y direction. This is because there are many cases where it is easier to pattern the end portion of the stacked body into a stairstep configuration than to increase the number of sizes of the holes. Thereby, the manufacturing cost of the semiconductor memory device as an entirety can be effectively reduced further.

In the case where the general description described above is applied to the first embodiment described above, the first embodiment has (m×n) types of contacts formed by making holes having (m×n) types of sizes in the hard mask. This method is particularly favorable in the case where, for example, the value of (m×n) is relatively small and holes having (m×n) types of sizes can be made easily. According to this method, the number of processes is small and the positional alignment of the terraces and the contacts is easier because it is completely unnecessary to pattern the end portion 15b of the stacked body 15 into a stairstep configuration.

Although examples are illustrated in the embodiments described above in which a hard mask made of silicon oxide (e.g., the hard mask 43 illustrated in FIG. 3A) and a mask material made of silicon nitride or silicon carbide (e.g., the mask material 45 illustrated in FIG. 3B) are used when making the contact holes, the invention is not limited thereto.

For example, even in the case where the hard mask is formed of silicon oxide, other than the silicon nitride and the silicon carbide illustrated in the embodiments described above, fluorocarbon or silicon can be used as the mask material. A silicon nitride film may be used as the hard mask. In such a case, silicon oxide, silicon carbide, fluorocarbon, or silicon can be used as the mask material. A resist mask may be used instead of the hard mask. In such a case, silicon oxide, silicon nitride, silicon carbide, fluorocarbon, or silicon can be used as the mask material. However, it is necessary to re-form the upper layer insulating film 20 in the case where the resist mask is used instead of the hard mask. In any case, it is necessary for the mask material to be a material different from the insulating film 17 inside the stacked body 15 because it is necessary to ultimately remove the mask material.

Although examples are illustrated in the embodiments described above in which the stacked body 15 is constructed by alternately stacking the electrode films 16 and the insulating films 17, the memory holes are made in the stacked body 15, and the memory film and the semiconductor member are formed inside the memory holes, the invention is not limited thereto. For example, the stacked body may be constructed by alternately stacking films of two different types of materials such as a silicon oxide film and a silicon nitride film regardless of being a conductive film or an insulating film, the memory holes may be made in this stacked body, and one of the films (e.g., the silicon nitride film) may be replaced with an electrode film after filling the memory film and the semiconductor member.

According to the embodiments described above, a low-cost semiconductor memory device and a method for manufacturing the same can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
   a stacked body including a plurality of electrode films stacked alternately with a plurality of insulating films, a configuration of an end portion of the stacked body being a stairstep configuration including a terrace formed for each of the electrode films;
   contacts, each of the contacts having a lower end connected to a portion of the electrode film forming the terrace;
   a semiconductor member provided inside a portion of the stacked body other than the end portion to extend in a stacking direction of the insulating films and the electrode films; and
   a charge storage layer provided between the electrode film and the semiconductor member,
   an upper end portion of one of the contacts connected to one of the electrode films being thicker than an upper end portion of one other of the contacts connected to one other of the electrode films positioned higher than the one of the electrode films, the one of the contacts being finer downward in stages, and the one of the contacts becoming discontinuously finer at a level of the electrode film.

2. The device according to claim 1, wherein the terraces are arranged in a chessboard-like configuration as viewed from the stacking direction.

3. The device according to claim 2, wherein
   diameters of the upper end portions of the contacts arranged along a first direction are different from each other,
   (n−1) electrode films are interposed between two of the electrode films respectively connected to two of the contacts mutually adjacent in the first direction, and
   two of the electrode films respectively connected to two of the contacts mutually adjacent in a second direction are adjacent to each other in the stacking direction,
   the first direction and the second direction are two directions of the arrangement of the terraces, m is a number of the terraces arranged in the first direction, n is a number of the terraces arranged in the second direction.

4. The device according to claim 3, wherein the value of n is not less than the value of m.

5. The device according to claim 1, wherein a surface area of a lower end of the one of the contacts is equal to a surface area of a lower end of the one other of the contacts.

6. The device according to claim 1, wherein the one of the contacts is discontinuously finer at a level of the electrode film in two stages.

7. The device according to claim 1, wherein the one of the contacts is discontinuously finer at a level of the electrode film in three stages.

8. The device according to claim 1, wherein the one of the contacts is discontinuously finer at a level of the electrode film in four stages.

* * * * *